United States Patent [19]
Coulombe et al.

[11] Patent Number: 5,797,764
[45] Date of Patent: Aug. 25, 1998

[54] LOW RETURN LOSS AND LOW CROSSTALK TELECOMMUNICATIONS ELECTRIC CIRCUIT

[75] Inventors: David J. Coulombe, Skokie; Ray Matlin, Woodridge, both of Ill.

[73] Assignee: Homaco, Inc., Chicago, Ill.

[21] Appl. No.: 798,921

[22] Filed: Feb. 12, 1997

[51] Int. Cl.$^6$ .................................................. H01R 9/09
[52] U.S. Cl. ................................................ 439/55; 439/941
[58] Field of Search ............................ 439/55, 641, 676, 439/74, 75, 61; 333/1, 12

[56] References Cited

U.S. PATENT DOCUMENTS

| | | | |
|---|---|---|---|
| 5,295,869 | 3/1994 | Siemon et al. | 439/676 |
| 5,299,956 | 4/1994 | Brownell et al. | 439/638 |
| 5,310,363 | 5/1994 | Brownell et al. | 439/676 |
| 5,326,284 | 7/1994 | Bohbot et al. | 439/676 |
| 5,547,405 | 8/1996 | Pinney et al. | 439/941 |
| 5,575,686 | 11/1996 | Noschese | 439/74 |

OTHER PUBLICATIONS

*TIA/EIA Telecommunications Systems Bulletin., Additional Transmission Specification for Unshielded Twisted–Pair Connecting Hardware*, TSB40–A, Jan., 1994.

*Printed Circuit Design*, Gerald Ginsburg, McGraw–Hill, 1991, pp. 67–84.

*Balance of Twisted–Pair Cabling*, A Siemon Company Publication, pp. 8–10.

"Connector Modeling", Dr. Richard Elco and David Gates, *Interconnection Technology*, May 1993, pp. 14–18.

"Optimizing Signal Integrity in High Speed PCB Connectors", Fabrizio Zanella and Mark Gailus, Teradyne, Inc., *Electronic Packaging & Production*, Apr., 1993, pp. 24–28.

"(Simulation + X) + (Analysis + X) = A High Speed Solution", Eric Bracken, *Printed Circuit Design*, May, 1994, pp. 9–15.

"High Speed Problems", John Berrie, *Printed Circuit Design*, May, 1993, pp. 14–19.

"Fun with S–Parameters", C.G. Masi, *Test & Measurement World*, May, 1992, pp. 75, 76 and 78.

*Electronic Packaging and Interconnection Handbook*, Charles A. Harper, McGraw–Hill, 1991, pp. 11.41–11.55.

*Signal Systems and Communications*, B.P. Lathi, John Wiley and Sons, 1965, pp. 336 and 387.

*Line Drivers and Receivers*, Fairchild Semiconductor, 1975, pp. 2.3–3.20.

*Primary Examiner*—P. Austin Bradley
*Assistant Examiner*—T. C. Patel
*Attorney, Agent, or Firm*—Anthony S. Zummer

[57] ABSTRACT

A telecommunications electric circuit having a low return loss and low crosstalk is adapted for use with unshielded twisted pairs of connecting wires. The circuit includes a pair of elongated circuit conductors parallel to each other over a substantial portion of their respective lengths. Each circuit conductor being a trace having a uniform width over a substantial portion of the length of the trace. Each circuit conductor trace having a width equal to the width of the other trace of the pair. Each of the circuit conductor traces has a uniform thickness. The circuit conductor traces are spaced apart a uniform distance which distance is determined from the center of each trace to the center of the other trace. The uniform distance being no greater than twice the width of one of said traces. A compensation trace is spaced from, parallel to and aligned with a portion of each of the respective circuit conductors.

9 Claims, 23 Drawing Sheets

LOW RETURN LOSS AND LOW CROSSTALK TELECOMMUNICATIONS ELECTRIC CIRCUIT

BACKGROUND OF THE INVENTION

Unshielded twisted pair connecting wires are widely utilized in telecommunication systems. Standards for unshielded twisted pair are set forth 64 ANSI/TIA/EIA. The extended use of telecommunication systems has set up an industry test method for unshielded twisted pairs in TSB40A. As higher frequencies are utilized, a Category Transmission requirement is identified for Category 5 Transmission which sets standards for band with up to 100 MHz.

The standards for unshielded twisted pair connectors set forth in TSB40A includes limits for near-end crosstalk and return loss. Accepted methods of improving short link crosstalk values is to add conductor traces to both legs of a connector. U.S. Pat. No. 5,299,956, entitled, "Low Cross Talk Electrical Connector System", issued Apr. 5, 1994, to Brownell, et al. and U.S. Pat. No. 5,310,363, entitled, "Impedance Matched Reduced Cross Talk Electric Connector System", issued May 10, 1994, to Brownell, et al. teach the concept of adding parallel compensating conductors adjacent to the signal conductors which compensating conductors are in the same plane as the signal conductors. Another method of compensating for crosstalk is to provide capacitance between the conductors. The capacitance may be in discreet capacitors or plated-through holes which serve as capacitive shunts. The utilization of plated-through holes is taught in U.S. Pat. No. 5,295,869, entitled, "Electrically Balanced Connector Assembly", issued Mar. 22, 1994, to Siemon, et al.

It is desirable to provide a connecting circuit for use in telecommunications which meets the standards of Category 5 Transmission.

SUMMARY OF THE INVENTION

The present invention relates to a low return loss and low crosstalk electric circuit which is particularly adapted for connecting portions of a telecommunications system having unshielded twisted pairs of conductors. The circuit includes a pair of elongated circuit conductors parallel to each other over a substantial portion of their respective lengths. Each of the circuit conductors being a conductor trace having a uniform width over a substantial portion of the length of the trace. Each circuit conductor trace having a width equal to the width of the other trace of the pair of circuit conductors. Each of the circuit conductor traces having a uniform thickness. The circuit conductor traces being spaced apart a uniform distance over a substantial portion of the parallel lengths of the traces. The uniform distance of the circuit conductor traces determined from the center of each trace to the center of the other of the respective circuit conductor traces. The uniform distance between the circuit conductor traces being no greater than twice the width of each of the traces. A pair of compensation traces is spaced from, parallel to and aligned with a portion of each of the respective the circuit conductor traces.

DESCRIPTION OF THE INVENTION

Figure 1:
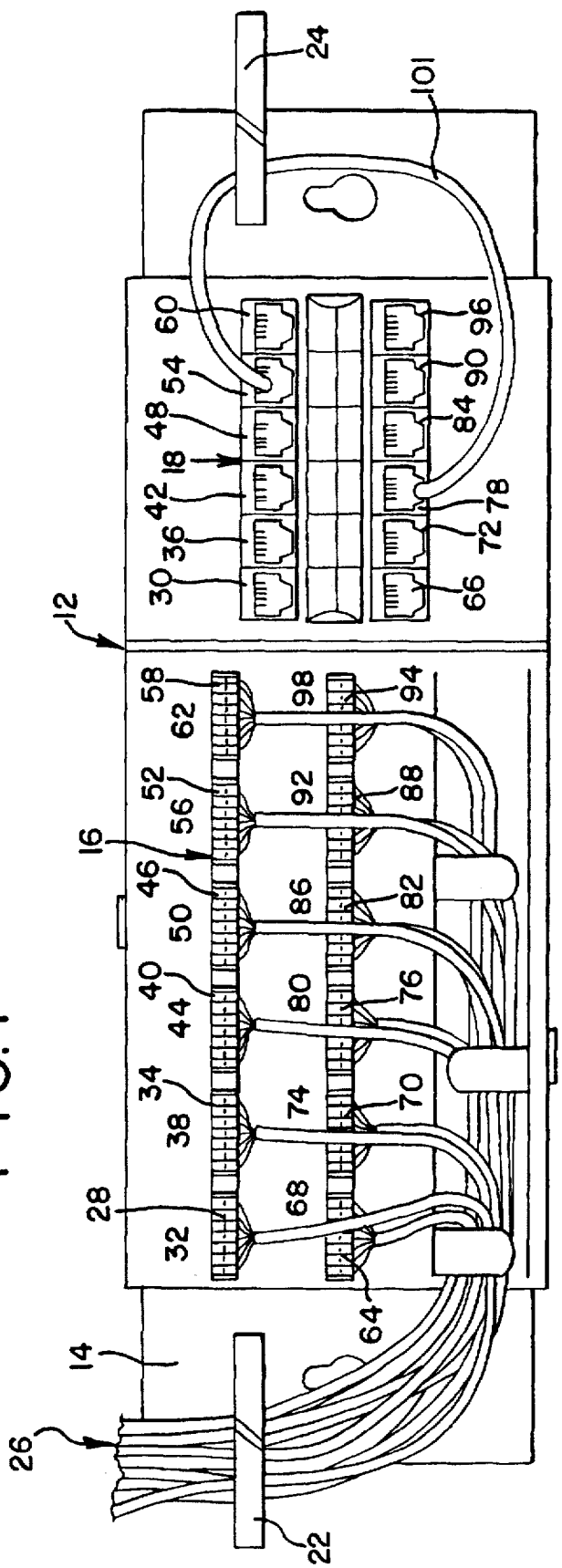
FIG. 1 is a plan view of a patch panel including a circuit board embodying the instant invention showing unshielded twisted pairs of wires entering the patch panel through connector blocks and a patch cord between conventional jacks.

Referring now to the drawings, and especially to FIG. 1, a patch panel generally indicated by numeral 12 generally includes a mounting plate 14 with a connector block assembly 16 adjacent to one end and a jack assembly 18 adjacent to the other end. The connector block assembly is connected to the jack assembly through a printed circuit board 20 of FIG. 2, which includes a specific embodiment of the present invention; namely, a low return loss and low crosstalk circuit disclosed in detail hereinafter.

A conventional cable split ring 22 is mounted on the end of the plate 14 adjacent to connector assembly 16 and a patch cord split ring 24 is mounted on the plate adjacent to jack assembly 18. A plurality of conventional cables 26 is held in split ring 22. Each of the cables includes a plurality of unshielded twisted pairs of wires which are connected to the connector block assembly.

Conventional punch down (insulation displacement contact [IDC]) connector blocks make up the connector block assembly 16, though other IDC connector blocks may be used. The connector blocks are each connected to a specific jack of jack assembly 18 through the circuit board to make up individual ports. In this instance, the jacks are well known 8 position modular jacks, though other jacks may be used. Connector block 28 is connected to jack 30 to make up a port 32. Connector block 34 is connected to jack 36 to make up a port 38. Connector block 40 is connected to jack 42 to make up port 44. Connector block 46 is connected to jack 48 to make up port 50. Connector block 52 is connected to jack 54 to make up port 56. Connector block 58 is connected to jack 60 to make up port 62. Connector block 64 is connected to jack 66 to make up port 68. Connector block 70 is connected to jack 72 to make up port 74. Connector block 76 is connected to jack 78 to make up port 80. Connector block 82 is connected to jack 84 to make up port 86. Connector block 88 is connected to jack 90 to make up port 92. Connector block 94 is connected to jack 96 to make up port 98.

Figure 23:
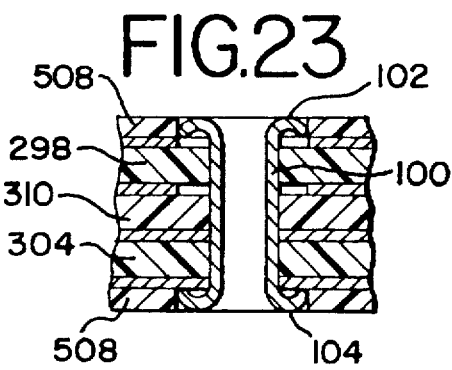
FIG. 23 is a cross sectional view showing a plated-through hole taken on Line 23—23 of FIG. 3.

Each of the ports has eight connector plated-through holes to which is connected a respective conventional punch connector block. Each port has eight jack plated though holes to which is connected the respective jack. The construction of the through holes is well known. A typical through hole is shown in FIG. 23. The through hole includes a plated main body 100 with opposed pads 102 and 104 at opposite ends of the body. As is conventional, traces are connected to the main body to interconnect traces on different levels.

A connection patch cord 101 has one end connected to jack 54 and the other end connected to jack 78. As is conventional, the end in jack 78 may be plugged into another selected jack or the end in jack 54 may be plugged into another jack.

Port 32 includes eight identical connector plated-through holes 106, 108, 110, 112, 114, 116, 118 and 120. The connector plated-through holes are connected to the jack plated-through holes 122, 124, 126, 128, 130, 132, 134 and 136 are described in detail hereinafter. Port 38 includes eight connector plated-through holes 138, 140, 142, 144, 146, 148, 150 and 152. Port 38 has jack plated-through holes 154, 156, 158, 160, 162, 164, 166 and 168.

Port 44 includes connector plated-through holes 170, 172, 174, 176, 178, 180, 182 and 184. Port 44 also includes jack plated-through holes 186, 188, 190, 192, 194, 196, 198 and 200. Port 50 includes eight connector plated-through holes 202, 204, 206, 208, 210, 212, 214 and 216, which are connected to eight jack plated-through holes 218, 220, 222, 224, 226, 228, 230 and 232. Port 56 includes eight connector plated-through holes 234, 236, 238, 240, 242, 244, 246 and 248 and eight jack plated-through holes 250, 252, 254, 256, 258, 260, 262 and 264. Port 62 includes eight connector plated-through holes 266, 268, 270, 272, 274, 276, 278 and 280 are connected to jack plated-through holes 282, 284, 286, 288, 290, 292, 294 and 296.

Figure 2:
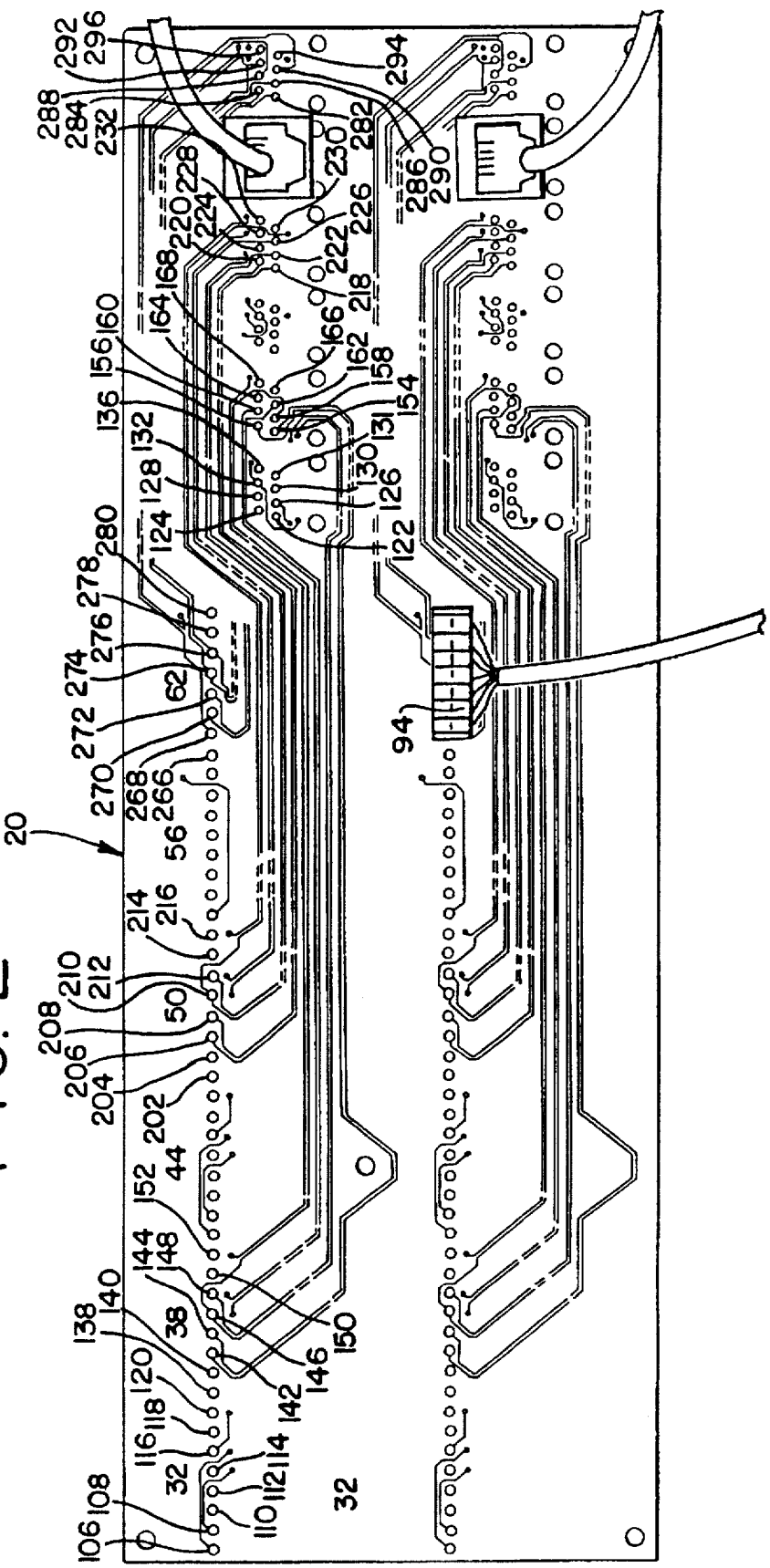
FIG. 2 is a plan view of the top layer of a circuit board which is a part of the patch panel of FIG. 1, showing a pair of jacks mounted on the board and a connector block mounted on the board.
Figure 3:
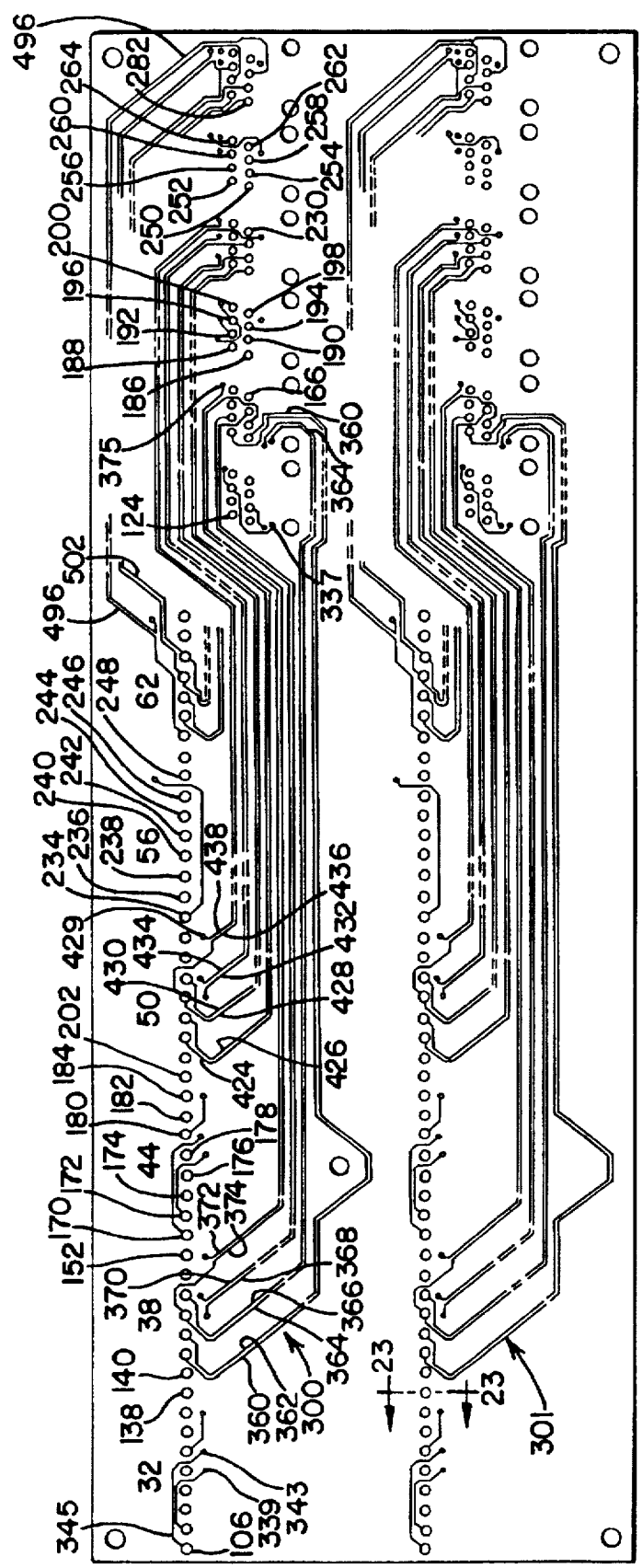
FIG. 3 is a plan view of the top trace pattern layer of the circuit board of FIG. 2, but with connectors and jacks removed showing the layout of compensation traces, which form the compensation circuit.
Figure 8:
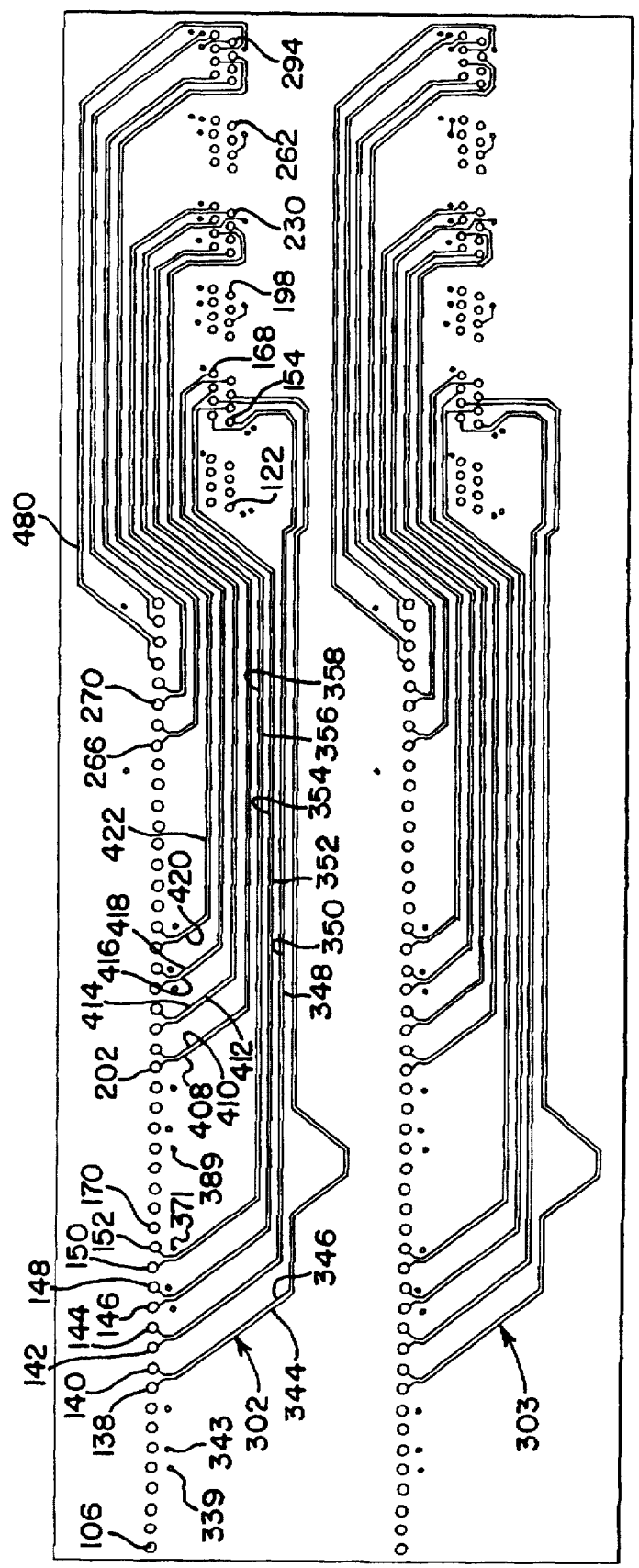
FIG. 8 is an plan view of a signal trace or circuit conductor trace layout which has portions aligned with the compensation trace layout of FIG. 3.
Figure 13:
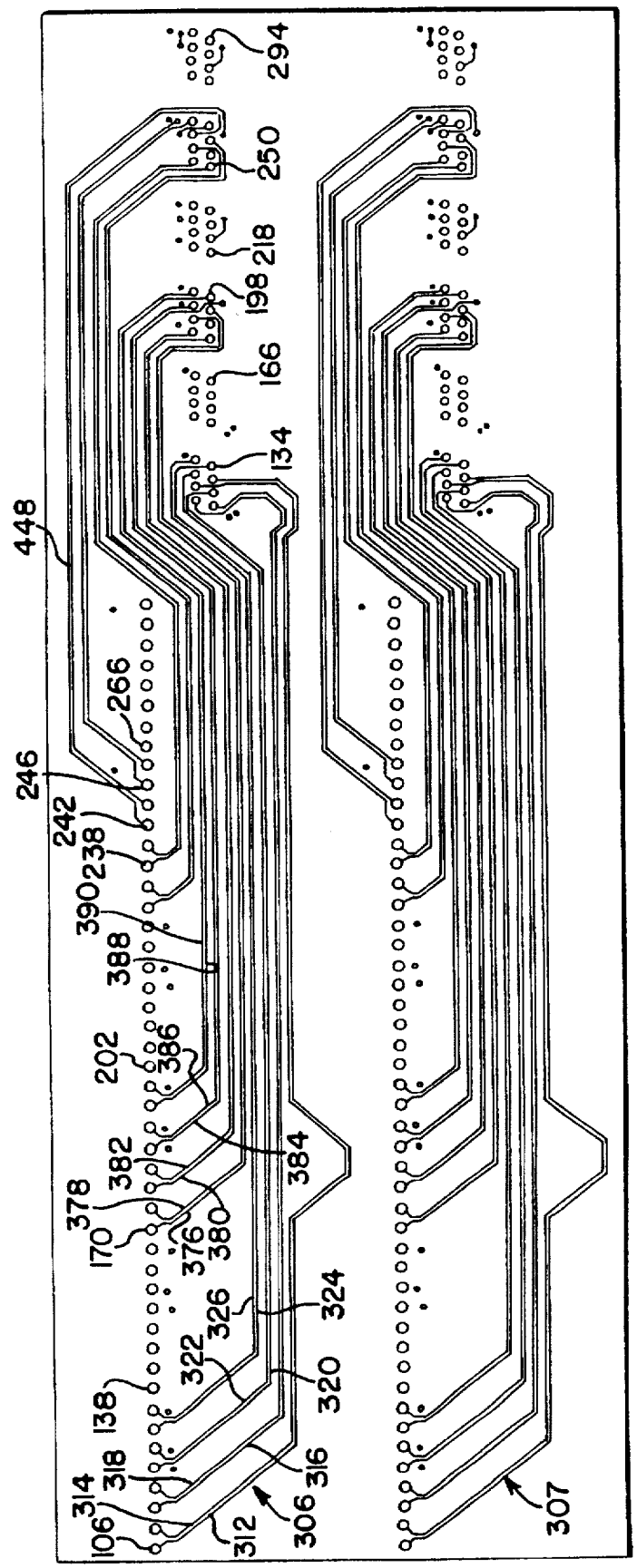
FIG. 13 is a plan view of a second or cognate signal trace or circuit conductor trace layout being a portion of the circuit board.
Figure 18:
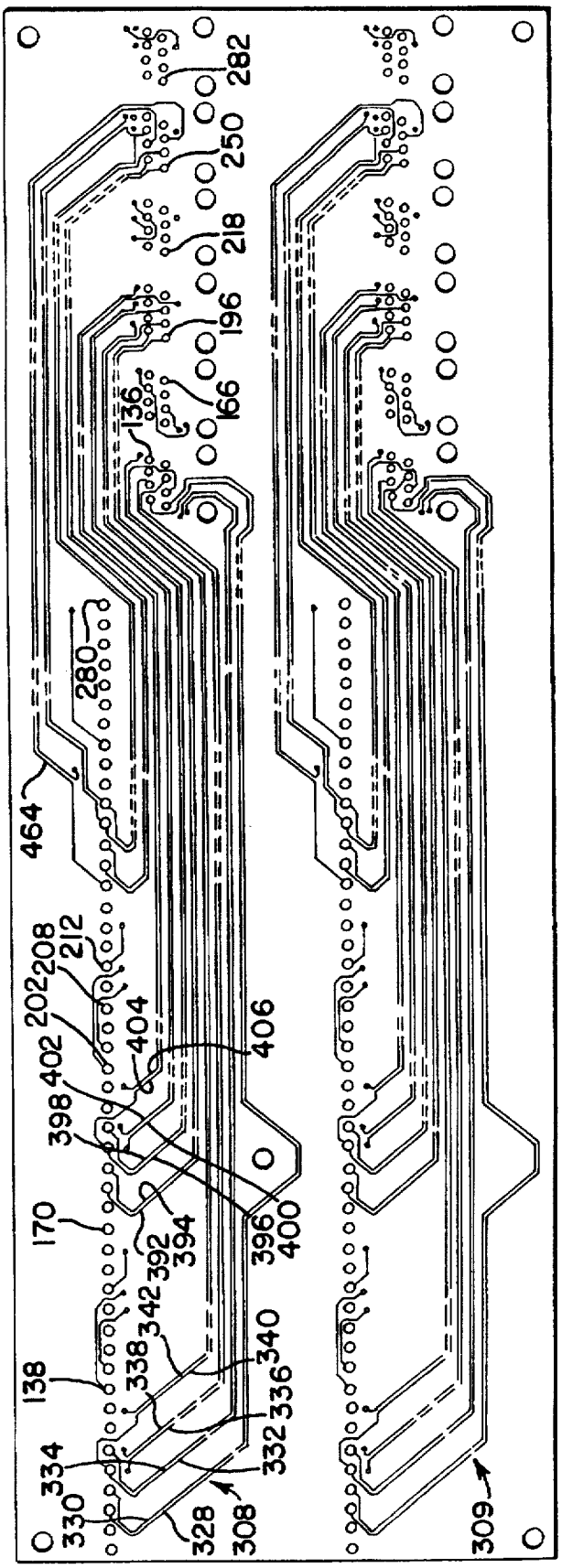
FIG. 18 is a plan view of the bottom layer of the circuit board and being a compensation trace circuit layout.

The printed circuit board provides an electric circuit for connection of the connector to the jacks. The board includes a conventional insulator sheet 298 having a thickness of 0.033 centimeters (0.013 inches) with identical compensator trace patterns 300 and 301, as shown in FIGS. 2 and 3, on its upper side and identical first signal trace or circuit or conductor trace patterns 302 and 303, as shown in FIG. 8 on the under side of sheet 298. A lower conventional insulator sheet 304 having the same thickness as sheet 298 has identical second or cognate signal or conductor trace patterns 306 and 307, as shown in FIG. 13, on its upper surface and identical second or cognate compensator trace patterns 308 and 309, as shown in FIG. 18, on its bottom or under surface. An insulator sheet 310 having a thickness of 0.074 centimeters (0.028 inches) is positioned between trace patterns 302 and 303 and 306 and 307. Compensator trace patterns 300 and 301 have traces spaced from and aligned with respective signal traces or circuit conductors of trace patterns 302 and 303. Compensator trace patterns 302 and 303 have traces spaced from and aligned with respective traces of the second signal trace or circuit conductor patterns 306 and 307. Signal trace or circuit conductor trace patterns 308 and 309 have all of the traces in a single plane. Compensator trace patterns 300 and 301 have all of the traces in a compensator trace plane which is spaced from and parallel to the single plane of the signal trace or circuit conductor patterns 302 and 303. Cognate signal trace or circuit conductor patterns 306 and 307 are in a single plane. Cognate compensator trace patterns 308 and 309 are in a cognate compensator trace plane which is spaced from and parallel to the single plane of the cognate signal trace or signal conductor trace patterns 306 and 307. The single planes of the signal trace or circuit conductor planes of 302 and 303 and 306 and 307 are spaced from each other and are parallel to each other. The planes of the compensator traces 300 and 301 and 308 and 309 are positioned outside of the adjacent planes of the signal trace or circuit conductor planes.

A detailed description of the electrical connection made by trace patterns 300, 302, 306 and 308 follows. Inasmuch as trace patterns 301, 303, 307 and 309 are identical to their respective trace patterns in their respective planes, there is no detailed description of those trace pattern.

Figure 14:
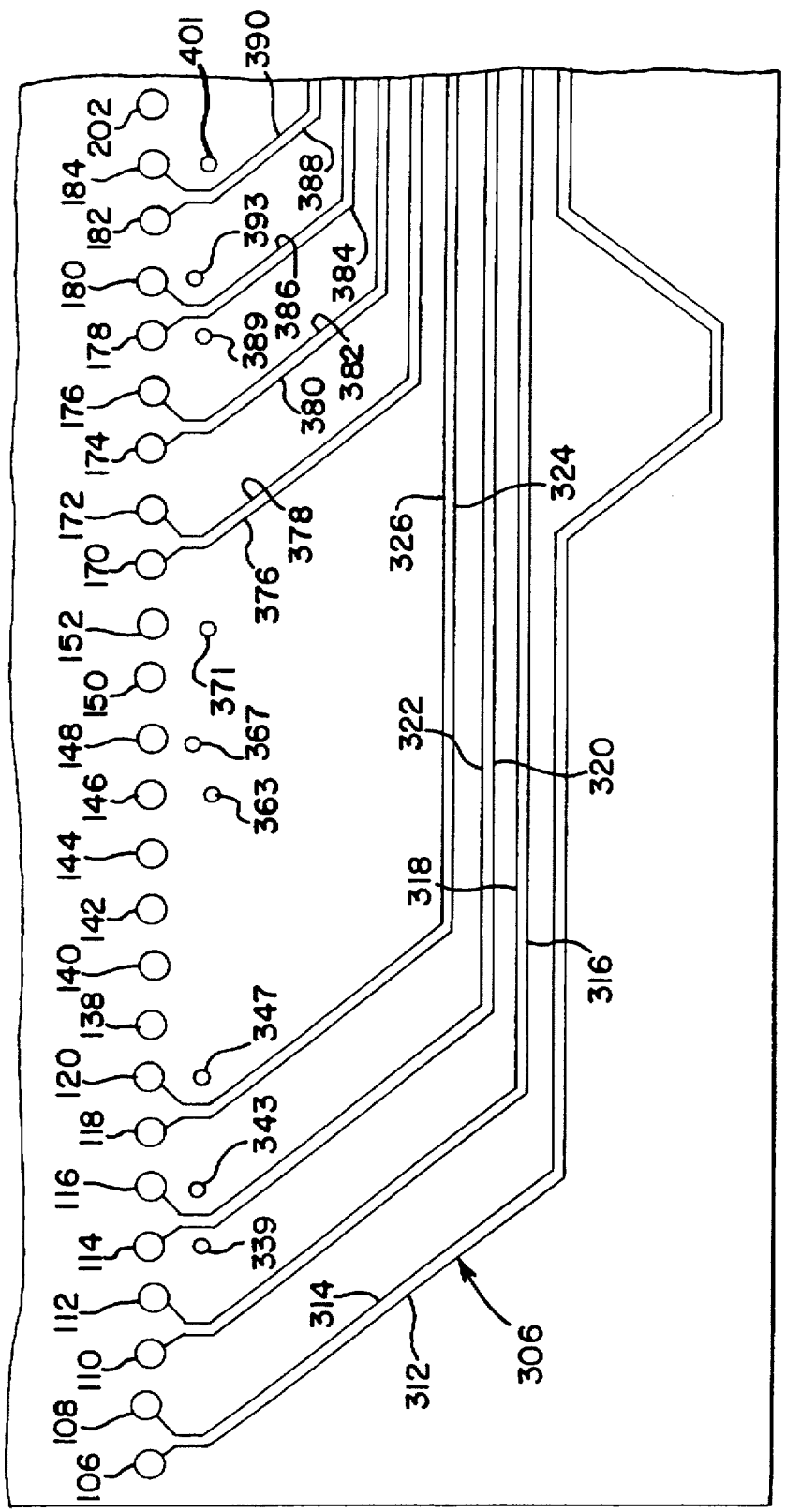
FIG. 14 is an enlarged plan view of a portion of the trace layout of FIG. 13 which receives connector blocks and is positioned adjacent to one edge of the board.
Figure 16:
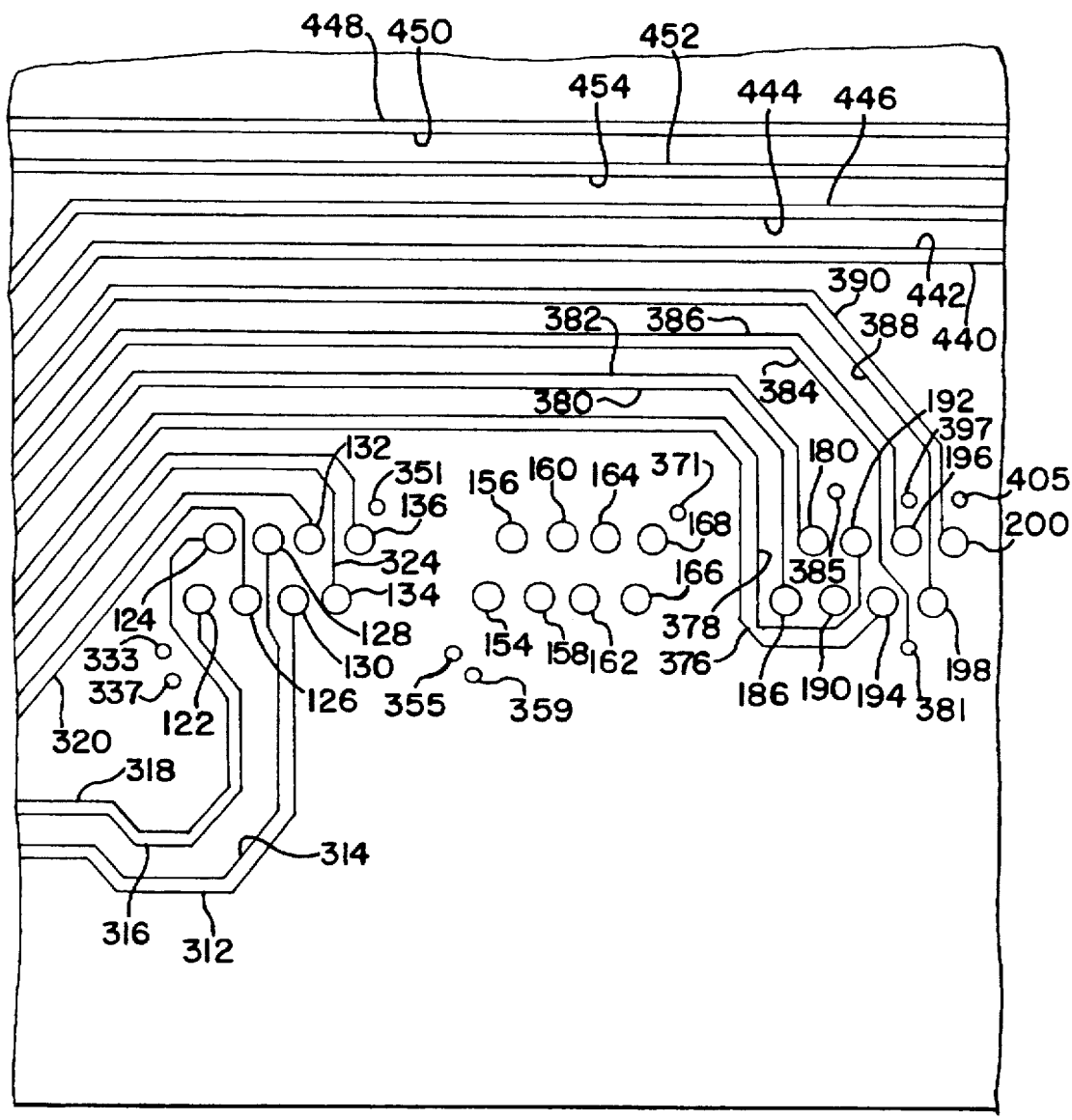
FIG. 16 is an enlarged plan view of a portion of the trace layout of FIG. 13 for receiving jacks and being that portion adjacent to the portion shown in FIG. 15.

The signal connection of the connector holes to the jack holes of port 32 is shown in FIGS. 13, 14 and 16. Connector holes 106 and 108 are connected to jack holes 130 and 128, respectively, by a pair of substantially parallel signal traces 312 and 314, respectively. Connector holes 110 and 112 are connected to jack holes 122 and 124, respectively, by a pair of substantially parallel signal traces 316 and 318, respectively. Connector holes 114 and 116 are connected to jack holes 126 and 132, respectively, by a pair of substantially parallel signal traces 320 and 322, respectively. Connector holes 118 and 120 are connected to jack holes 134 and 136, respectively, by a pair of substantially parallel signal traces 324 and 326, respectively.

In each of the pairs of signal traces 312 and 314, 316 and 318, 320 and 322, and 324 and 326, the traces run parallel to each other in a large part and are equidistantly spaced from each other for substantially the entire length of the traces, except for the ends of the traces where the traces diverge for connection to the respective connector holes or jack holes.

Figure 19:
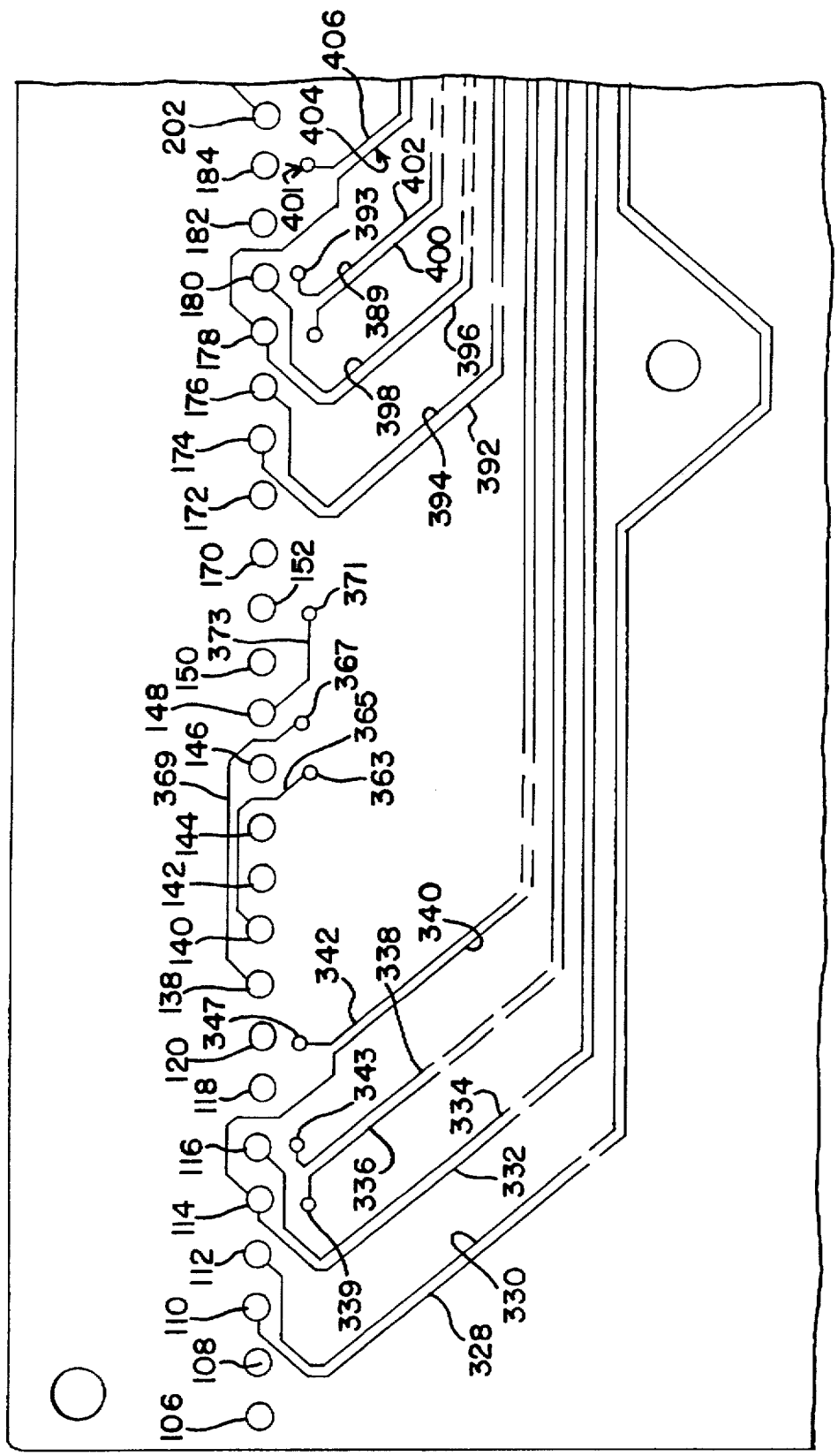
FIG. 19 is an enlarged plan view of a portion of the compensation circuit trace layout of FIG. 18 which receives connector blocks and is positioned adjacent to one edge.
Figure 21:
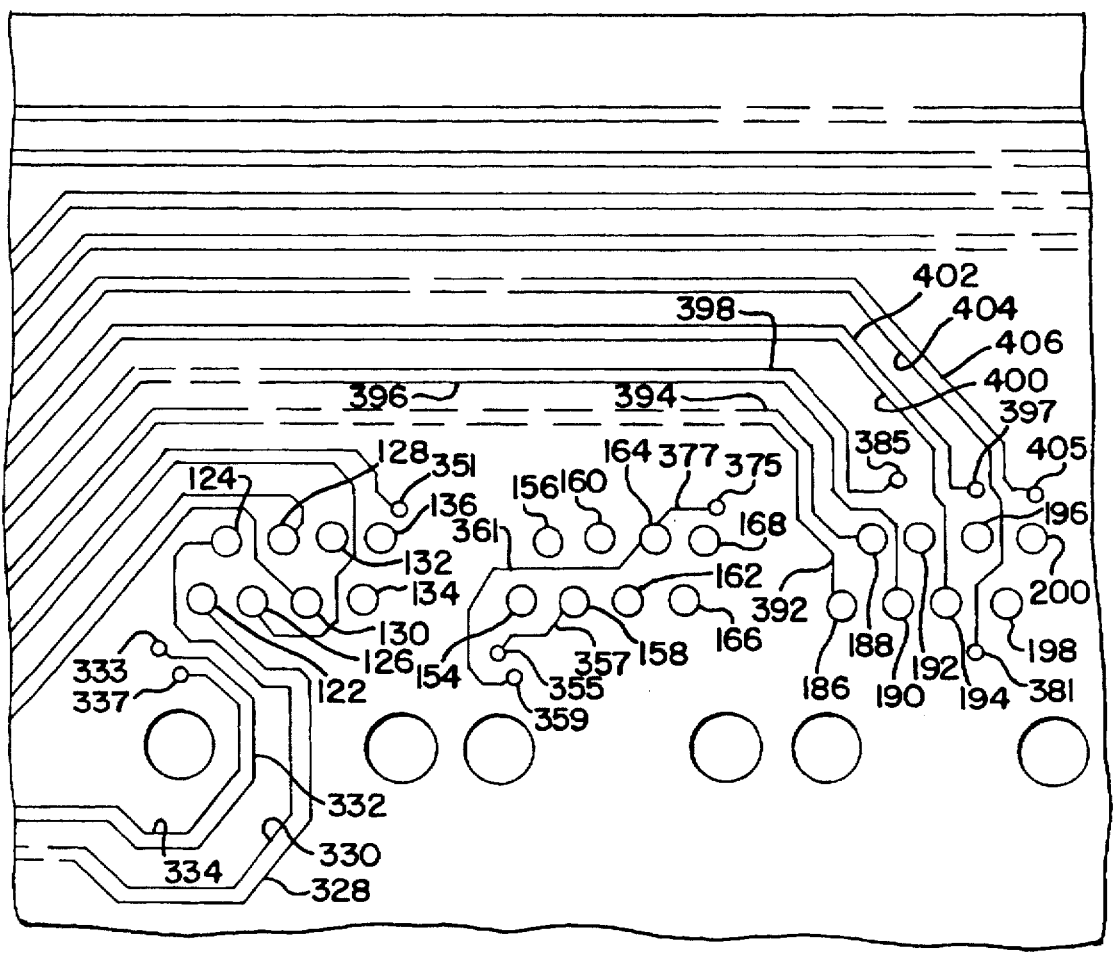
FIG. 21 is an enlarged plan view of a portion of the trace layout of FIG. 18 for receiving jacks and being that portion adjacent to the portion shown in FIG. 20.
Figure 24:
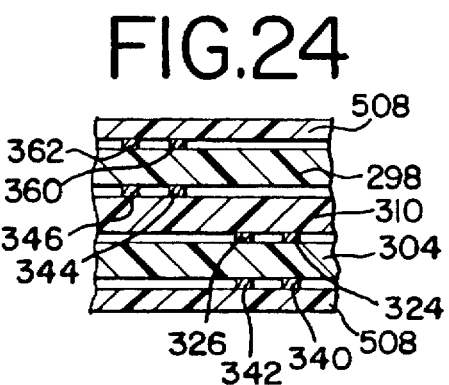
FIG. 24 is an enlarged fragmentary cross sectional view taken on Line 24—24 of FIG. 3.

Each of the signal traces has a parallel aligned compensation trace or compensate spaced therefrom. FIGS. 18, 19 and 21 show compensation trace pattern 308. Parallel compensation traces 328 and 330 are aligned for a substantial portion of their lengths with the respective signal traces 312 and 314. Trace 328 is connected to connector hole 110 at its connector end and the jack end is connected to jack hole 122. Compensation trace 330 has its connector end connected to connector hole 112 and its jack end connected to jack hole 124. Compensation traces 332 and 334 are aligned with respective signal traces 316 and 318. The connector end of compensation trace 332 is connected to connector hole 114 and the jack end is connected to jack hole 126 through transfer hole 333 and link trace 335. Transfer hole 333 is a transfer plated-through hole extending through insulator sheets 298, 304 and 310 to allow connection with trace pattern 300. Link trace 335 connects the transfer hole 333 to jack hole 126. This arrangement is conventional in printed circuit boards to allow traces to cross. Link trace 335 is part of trace pattern 300 shown in FIG. 6. Compensation trace 334 has its connector end connected to connector hole 116 and its jack end connected to jack hole 132 through transfer hole 337 and link trace 339, which is also part of trace pattern 300. Compensation traces 336 and 338 are aligned with signal traces 320 and 322, respectively. Compensation trace 336 has its connector end connected to connector hole 108 through transfer hole 339 and link trace 341 and its jack end connected to jack hole 130. Compensation trace 338 has its connector end connected to connector hole 106 through transfer hole 343 and link trace 345 and its jack end connected to jack hole 128. Parallel compensation traces 340 and 342 are aligned with signal traces 324 and 326, respectively, as is shown in FIG. 24. Compensation trace 340 has its connector end connected to connector hole 114 and its jack end connected to jack hole 126. Compensation trace 342 has its connector end connected to connector hole 116 through transfer hole 347 and link trace 349 and its jack end connected to jack hole 132 through transfer hole 351 and link trace 353. Each of the compensation traces has a gap in the trace of a magnitude identified for each trace in the table found below. Each of the compensation traces in each of the pairs is parallel to the other trace of that pair.

Figure 9:
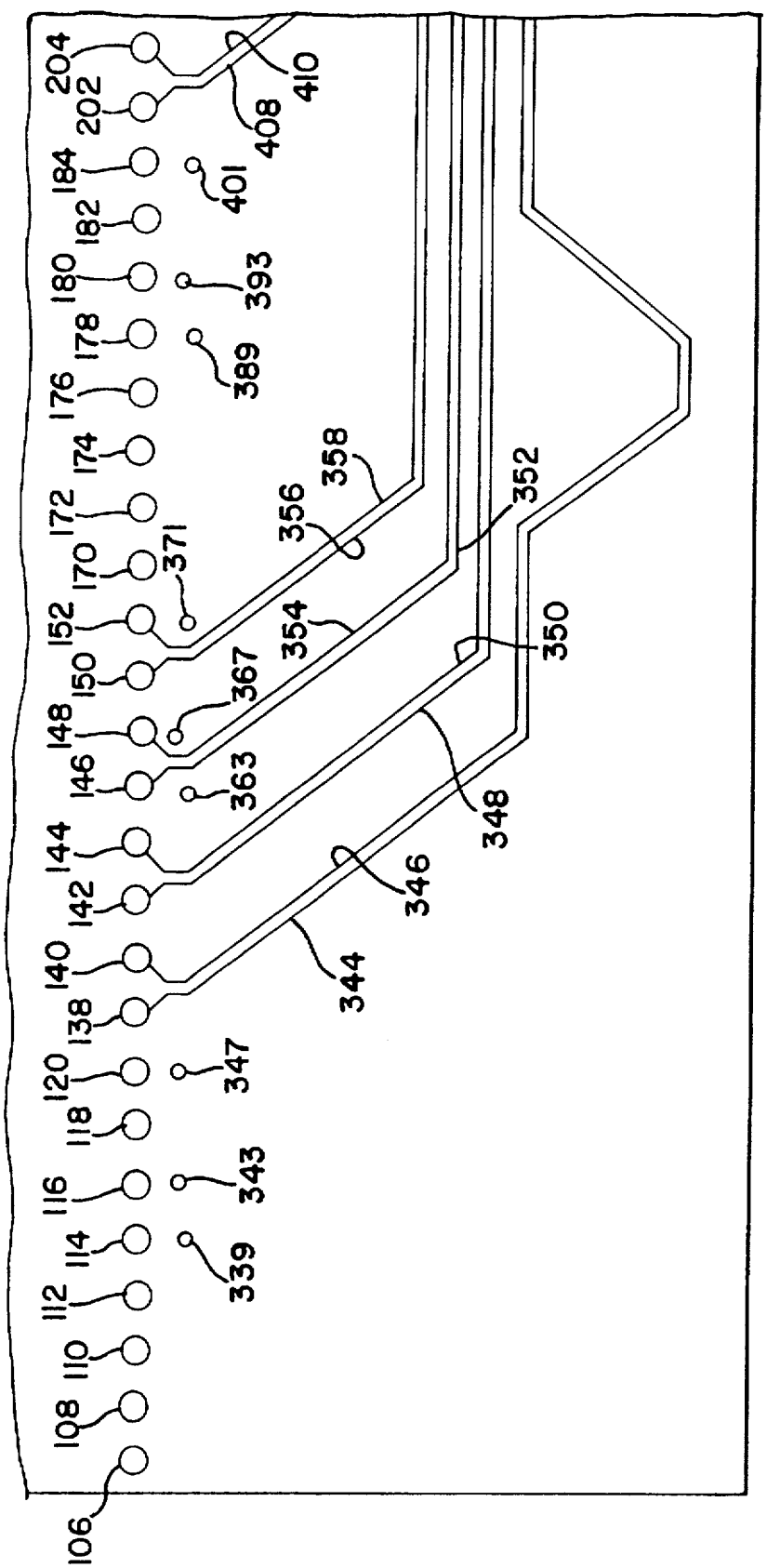
FIG. 9 is an enlarged plan view of a portion of the signal trace or circuit conductor trace layout of FIG. 8 which receives connector blocks and is positioned adjacent to one edge.
Figure 11:
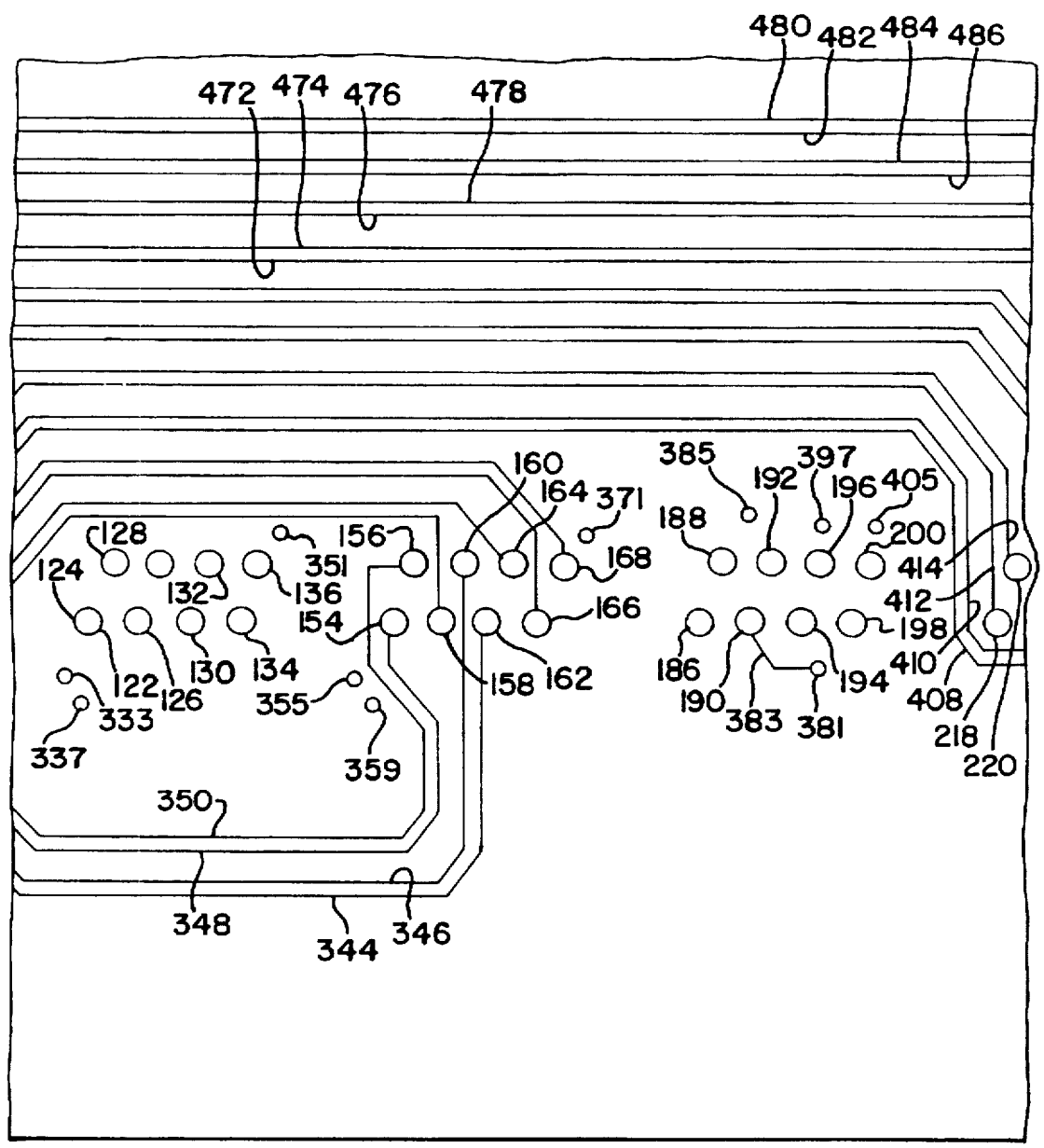
FIG. 11 is an enlarged plan view of a portion of the trace layout of FIG. 8 for receiving jacks and being that portion adjacent to the portion shown in FIG. 10.

Port 38 has its connector plated-through holes connected to its jack plated-through holes by a plurality of signal traces or circuit conductors as part of the signal trace pattern 302, as shown in FIGS. 8, 9 and 11. Connector holes 138 and 140 are connected to jack holes 162 and 160, respectively, by substantially parallel signal traces 344 and 346, respectively. Connector holes 142 and 144 are connected to jack holes 154 and 156, respectively, by substantially parallel signal traces 348 and 350, respectively. Connector holes 146 and 148 are connected to jack holes 158 and 164, respectively, by substantially parallel signal traces 352 and 354, respectively. Connector holes 150 and 152 are connected to jack holes 166 and 168, respectively, by substantially parallel signal traces 356 and 358, respectively.

In each of the pairs of signal traces 344 and 346, 348 and 350, 352 and 354, and 356 and 358, the traces in each of the pairs run parallel to each other for substantially the entire length of the traces, except for the ends of the traces where the traces diverge for connection to the respective connector holes or jack holes.

Figure 4:
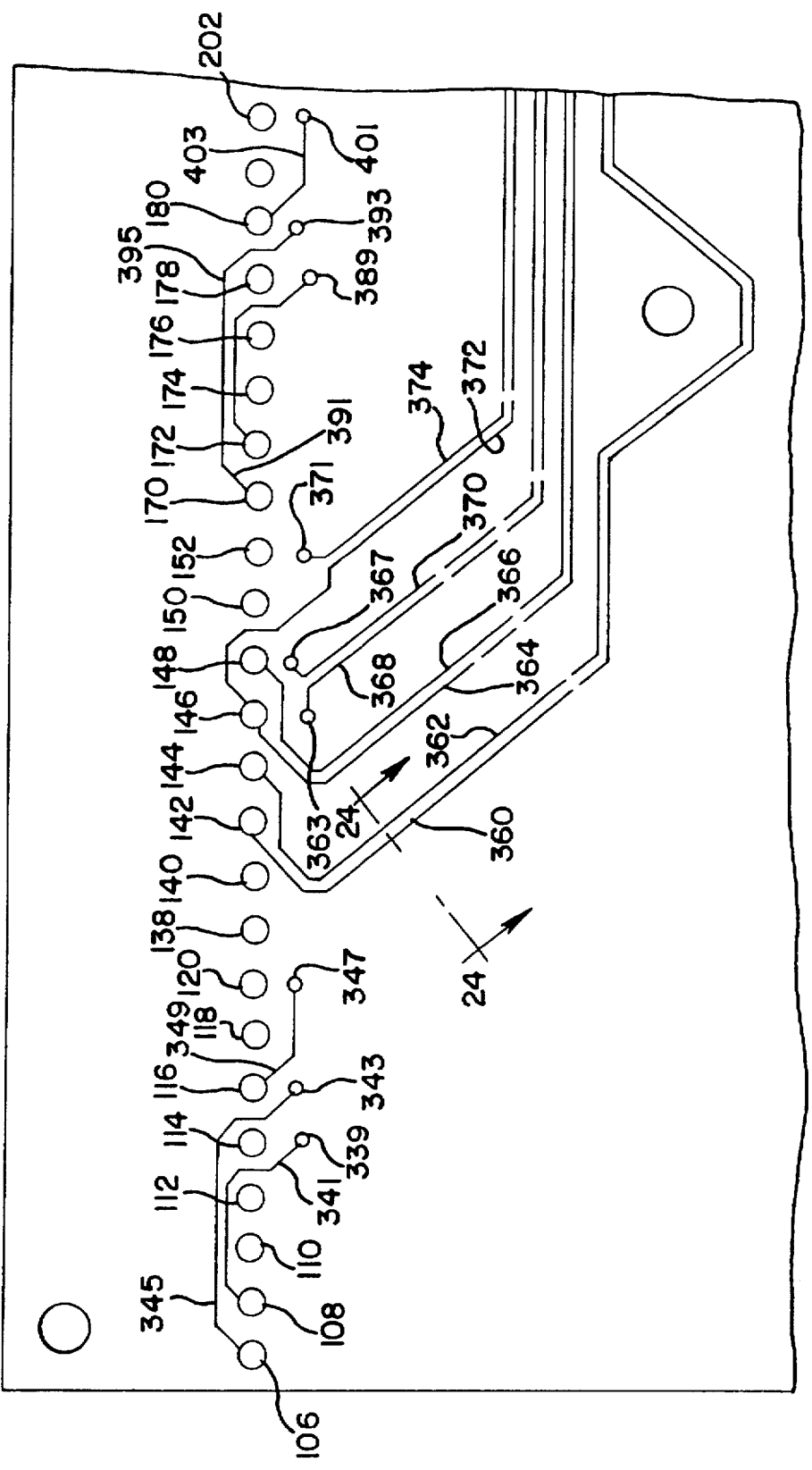
FIG. 4 is an enlarged plan view of a portion of one of the compensation trace layout of FIG. 3 which receives connector blocks and is positioned adjacent to one edge.
Figure 6:
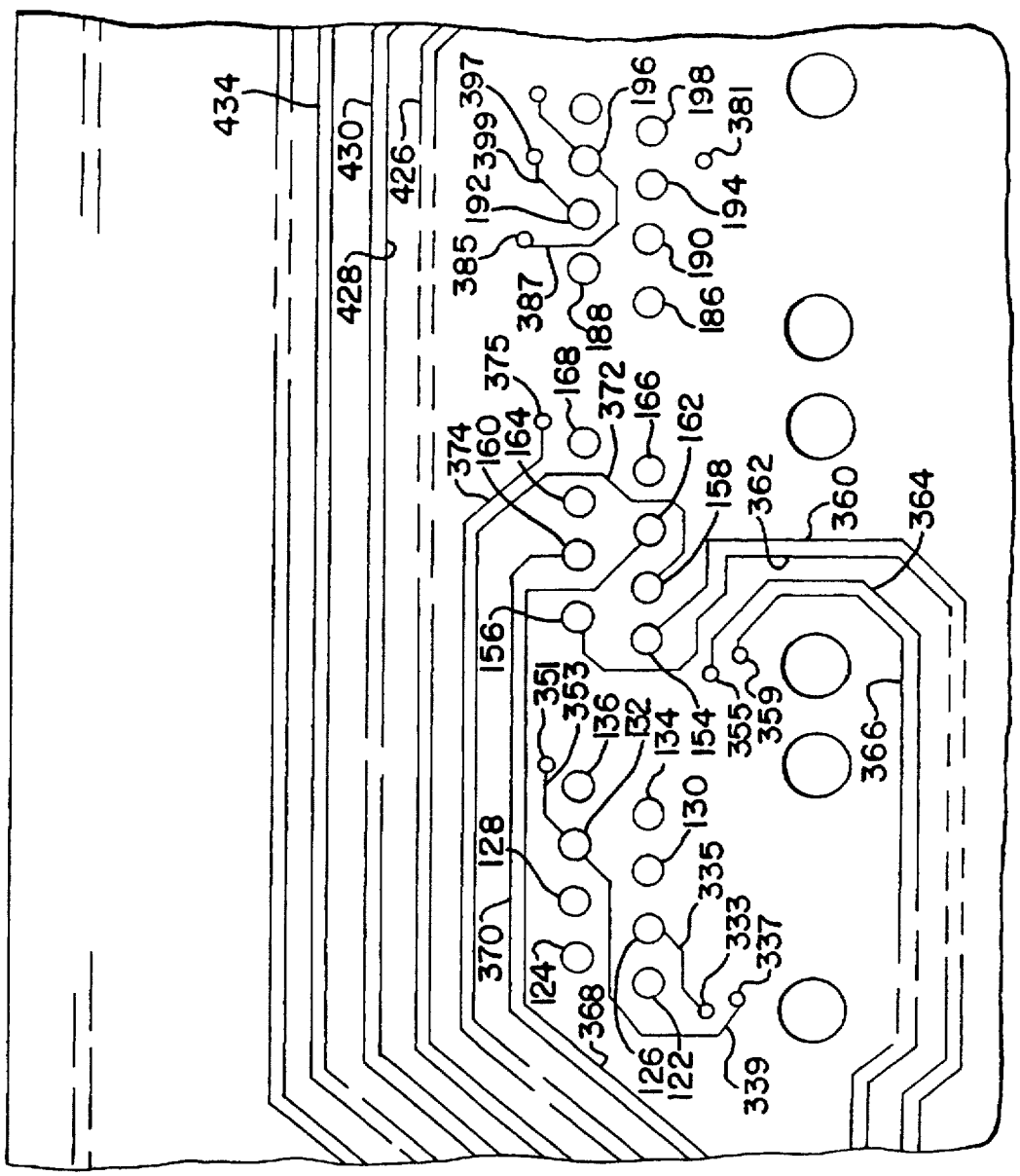
FIG. 6 is an enlarged plan view of a portion of the trace layout of FIG. 3 for receiving jacks and being that portion adjacent to the portion shown in FIG. 5.

Each of the signal traces of port 38 has a compensation trace aligned with and parallel thereto. Compensation trace pattern 300, which contains the compensation trace for the signal traces is shown in FIGS. 3, 4 and 6. Parallel compensation traces 360 and 362 are aligned respectively with signal traces 344 and 346, as shown in FIG. 24. Compensation trace 360 has its connector end connected to connector hole 142 and its jack end connected to jack hole 154. Compensation trace 362 has its connector end connected to the connector hole 144 and its jack end connected to jack hole 156. Compensation traces 364 and 366 are aligned with and parallel to the signal traces 348 and 350, respectively. Compensation trace 364 has its connector end connected to connector hole 146 and the jack end connected to jack hole 158 through transfer hole 355 and link trace 357. Compensation trace 366 has its connector end connected to connector hole 148 and its jack end connected to jack hole 164 through transfer hole 359 and link trace 361. Parallel compensation traces 368 and 370 are aligned with and parallel to signal traces 352 and 354, respectively. Compensation trace 368 has its connector end connected to connector hole 140 through transfer hole 363 and link trace 365 and its jack end connected to jack hole 162. Compensation trace 370 has its connector end connected to connector hole 138 through transfer hole 367 and link trace 369 and its jack end connected to jack hole 160. Parallel compensation traces 372 and 374 are aligned with and parallel to signal traces 356 and 358, respectively. Compensation trace 372 has its connector end connected to connector hole 146 and its jack end connected to jack hole 158. Compensation trace 374 has its connector end connected to connector hole 148 through transfer hole 371 and link trace 373 and its jack end connected to jack hole 164 through transfer hole 375 and link trace 377. The compensation traces 360, 362, 364, 366, 368, 370, 372 and 374 of port 38 all have gaps. The length of each of the gaps is set forth in the table found below.

The connection of the connector plated-through holes with the jack plated-through holes of port 44 by signal traces or circuit conductors is shown in trace pattern 306 of FIGS. 13, 14 and 16. Connector holes 170 and 172 are connected, respectively, to jack holes 194 and 192, respectively, by signal traces 376 and 378, respectively. Connector holes 174 and 176 are connected to jack holes 186 and 188, respectively, by signal traces 380 and 382. Connector hole 178 is connected to jack hole 190 by signal trace 384, which is connected to transfer hole 381 and link trace 383. Connector hole 180 is connected to jack hole 196 by signal trace 386. Connector holes 182 and 184 are connected to jack holes 198 and 200, respectively, by signal traces 388 and 390, respectively.

In each of the pairs of signal traces 376 and 378, 380 and 382, 384 and 386, and 388 and 390, the traces in each of the pairs run parallel to each other for substantially the entire length of the traces, except for the ends of the traces where the traces diverge for connection to the respective connector holes or jack holes.

Each of the aforementioned signal traces of port 44 has a respective spaced and parallel aligned compensation trace shown in compensation trace pattern 308 of FIGS. 18, 19 and 21. Parallel compensation traces 392 and 394 are aligned with signal traces 376 and 378, respectively, over a substantial portion of the compensation traces. Compensation trace 392 has its connector end connected to connector hole 174 and its jack end connected to jack hole 186. Compensation trace 394 has its connector end connected to connector hole 176 and its jack end connected to jack hole 188. Parallel compensation traces 396 and 398 are parallel to and are aligned with signal traces 380 and 382, respectively. Compensation trace 396 has its connector end connected to connector hole 178 and its jack end connected to jack hole 190. Compensation trace 398 has its connector end connected to connector hole 180 and its jack end connected to jack hole 196 through transfer hole 385 and link trace 387. A pair of parallel compensation traces 400 and 402 are aligned with signal traces 384 and 386, respectively. Compensation trace 400 has its connector end connected to connector hole 172 through transfer hole 389 and link trace 391 and its jack end connected to jack hole 194. Compensation trace 402 has its connector end connected to connector hole 170 through transfer hole 393 and link trace 395 and its jack end connected to jack hole 192 through transfer hole 397 and link trace 399. Parallel compensation traces 404 and 406 are aligned with and parallel to signal traces 388 and 390, respectively. Compensation trace 404 has its connector end connected to connector hole 178 and its jack end connected to jack hole 190 through transfer hole 381 and link trace 383. Compensation trace 406 has its connector end connected to connector hole 180 through transfer hole 401 and link trace 403 and its jack end connected to jack hole 196 through transfer hole 405 and link trace 407. Each of the pairs of compensation traces of port 40 are parallel to each other. Each of the compensation traces of port 40 is interrupted and has a gap therein. The size of the gap and the length of the trace is set forth in the table found below.

Figure 10:
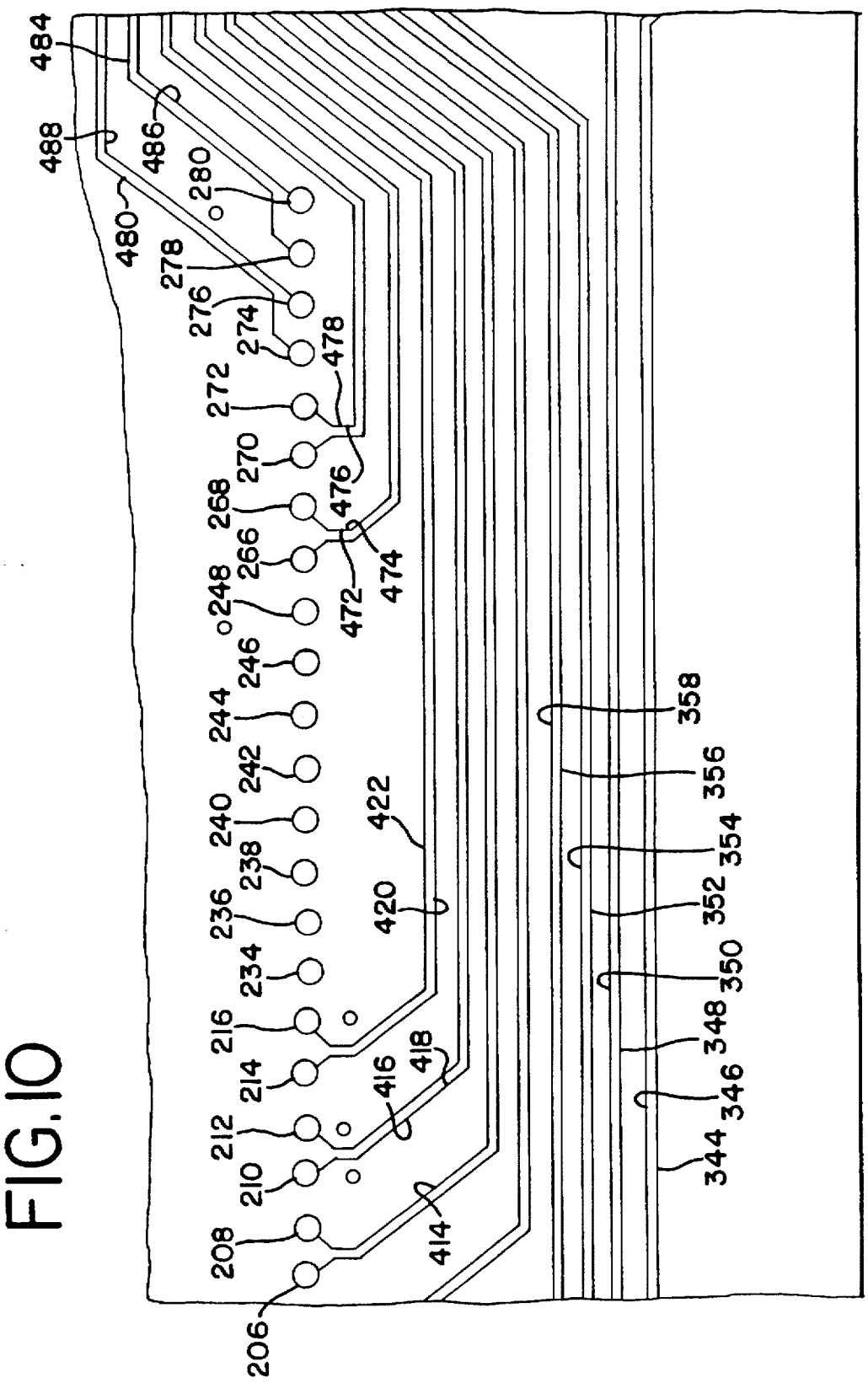
FIG. 10 is an enlarged plan view of a portion of the trace layout of FIG. 8 being that portion adjacent to the portion shown in FIG. 9.
Figure 12:
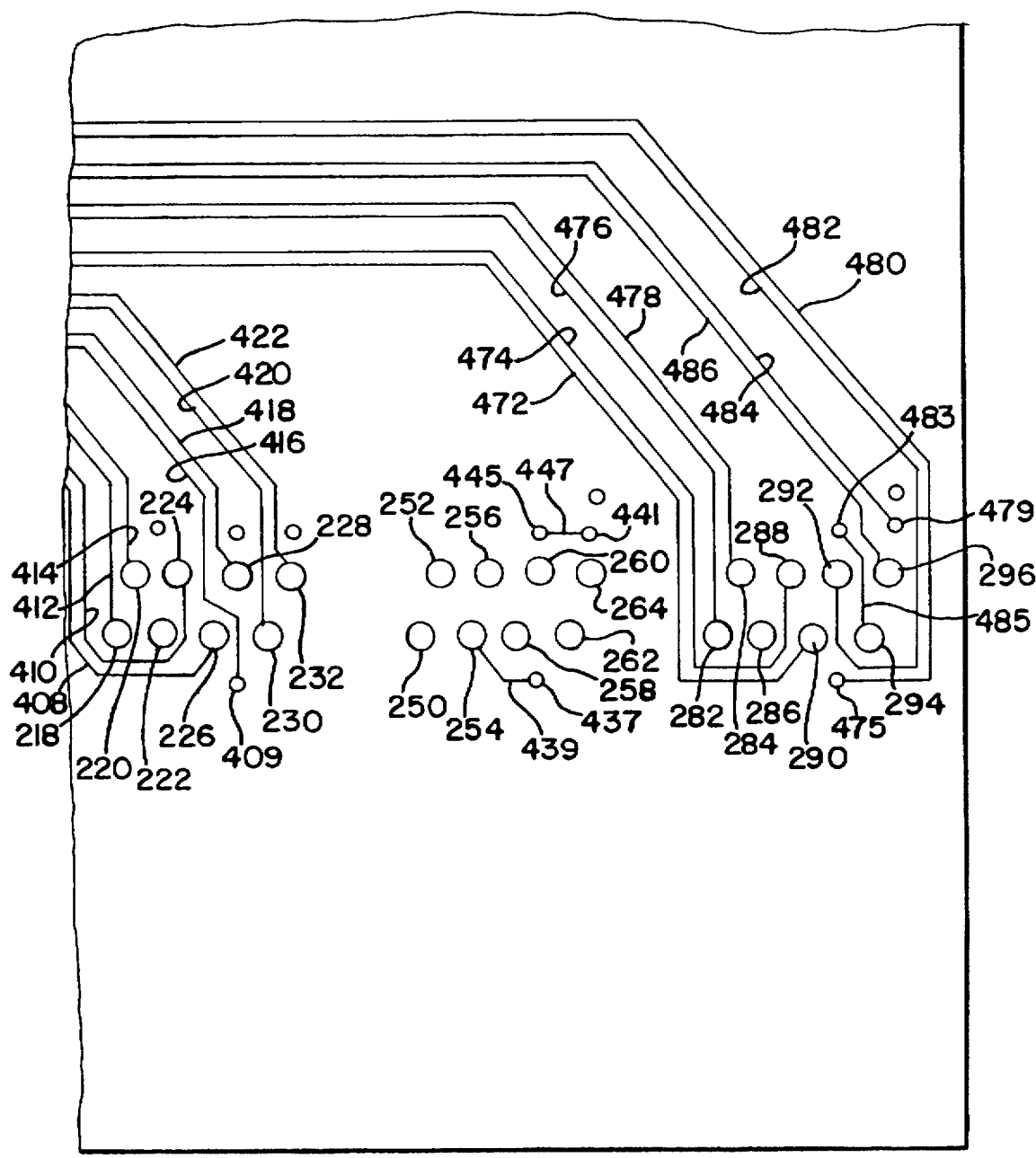
FIG. 12 is an enlarged plan view of a portion of the trace layout shown in FIG. 8 and being that portion adjacent to the portion shown in FIG. 11 and extending to one end of the trace layout.

The connection of the connector plated-through holes to the jack plated-through holes of port 50 by the signal traces or circuit conductors is shown in FIGS. 8, 10 and 12. Connector holes 202 and 204 are connected to jack holes 226 and 224, respectively, by a pair of substantially parallel signal traces 408 and 410, respectively. Connector holes 206 and 208 are connected to jack holes 218 and 220, respectively, by a pair of substantially parallel signal traces 412 and 414, respectively. Connector hole 210 is connected to jack hole 222 by signal trace 416 through transfer hole 409 and link trace 411. Connector hole 212 is connected to jack hole 228 by signal trace 418. Connector holes 214 and 216 are connected to jack holes 230 and 232, respectively, by a pair of substantially parallel signal traces 420 and 422, respectively.

Each trace in each of the pairs in each of the pairs of signal traces 408 and 410, 412 and 414, 416 and 418, and 420 and 422, runs parallel to other trace of the pair for substantially the entire length of the traces, except for the ends of the traces where the traces diverge for connection to the respective connector holes or jack holes.

Figure 5:
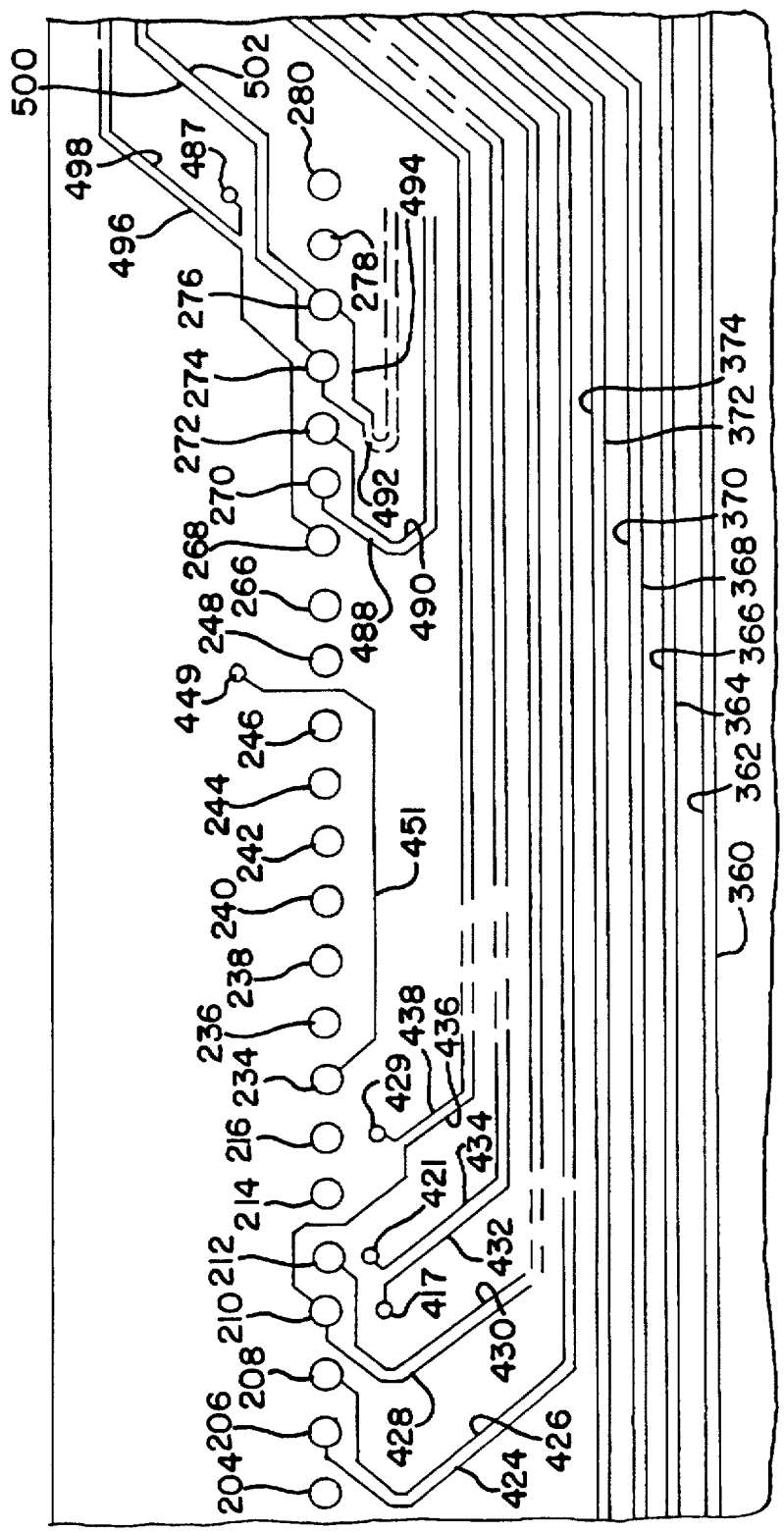
FIG. 5 is an enlarged plan view of a portion of the trace layout of FIG. 3 being that portion adjacent to the portion shown in FIG. 4.
Figure 7:
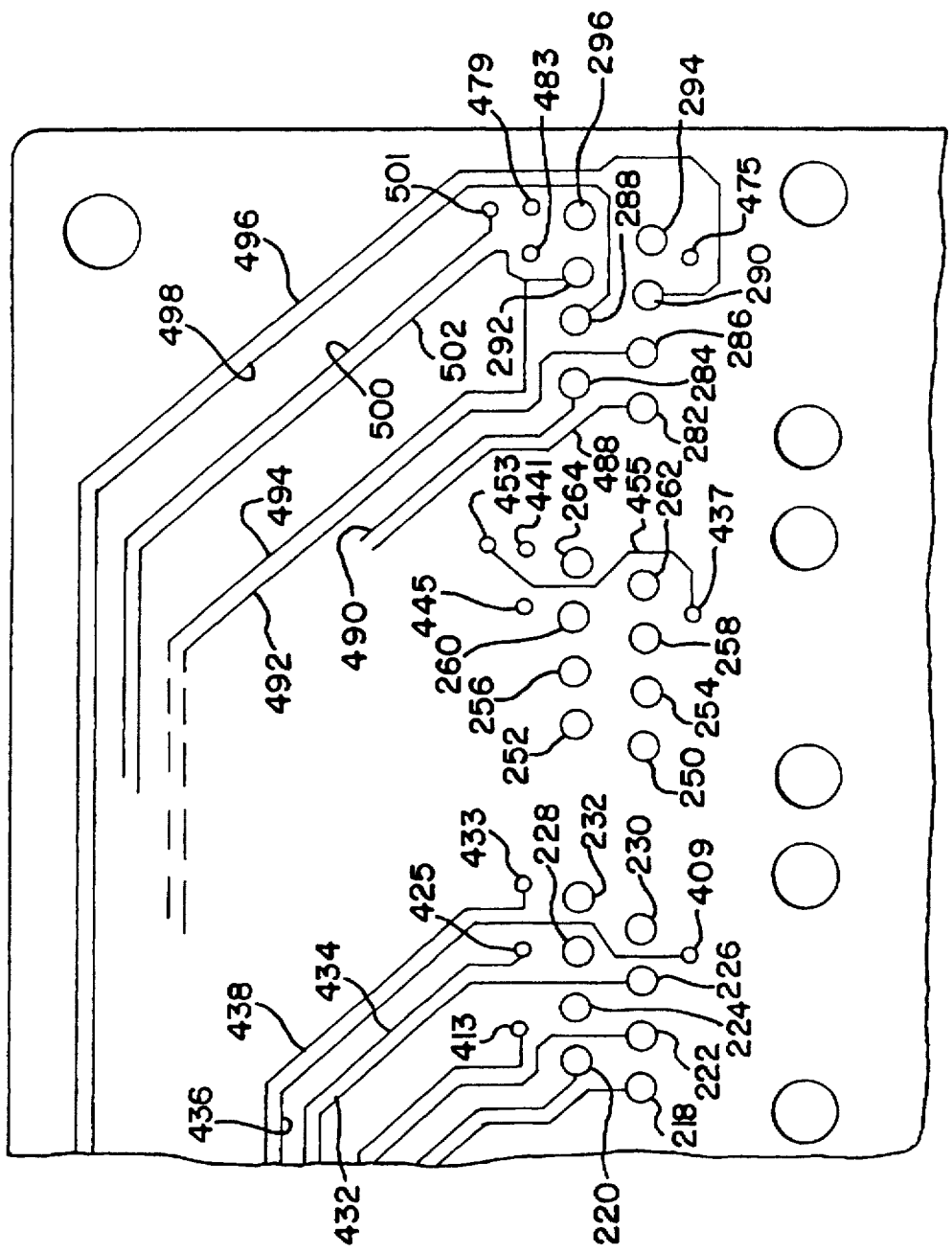
FIG. 7 is an enlarged plan view of a portion of the trace layout of FIG. 3 and being that portion adjacent to the portion shown in FIG. 6 and extending to one end of the trace layout.

Each of the signal traces has an aligned compensation trace parallel to and spaced therefrom which compensation trace pattern 300 is shown in FIGS. 3, 5 and 7. Parallel compensation traces 424 and 426 are aligned for a substantial portion of their length with respective signal traces 408 and 410. Trace 424 is connected to connector hole 206 at its connector end and the jack end is connected to jack hole 218. Compensation trace 426 has its connector end connected to connector hole 208 and its jack end connected to jack hole 220. Parallel compensation traces 428 and 430 are aligned with respective signal traces 412 and 414. The connector end of compensation trace 428 is connected to connector hole 210 and the jack end is connected to jack hole 222. Compensation trace 430 has its connector end connected to connector hole 212 and its jack end connected to jack hole 228 transfer hole 413 and link trace 415. Parallel compensation traces 432 and 434 are aligned with signal traces 416 and 418, respectively. Compensation trace 432 has its connector end connected to connector hole 204 through transfer hole 417 and link trace 419 and its jack end connected to jack hole 226. Compensation trace 434 has its connector end connected to connector hole 202 through transfer hole 421 and link trace 423 and its jack end connected to jack hole 224 through transfer hole 425 and link trace 427. Parallel compensation traces 436 and 438 are aligned with signal traces 420 and 422, respectively. Compensation trace 436 has its connector end connected to connector hole 210 and its jack end connected to jack hole 222 through transfer hole 409 and link trace 411. Compensation trace 438 has its connector end connected to connector hole 212 through transfer hole 429 and link trace 431 and its jack end connected to jack hole 228 through transfer hole 433 and link trace 435. Each of the compensation traces of port 50 has a gap in the trace of a magnitude identified for each trace in the table found below. Each of the compensation traces in each of the pairs in port 50 is parallel to the other trace of that pair.

Figure 15:
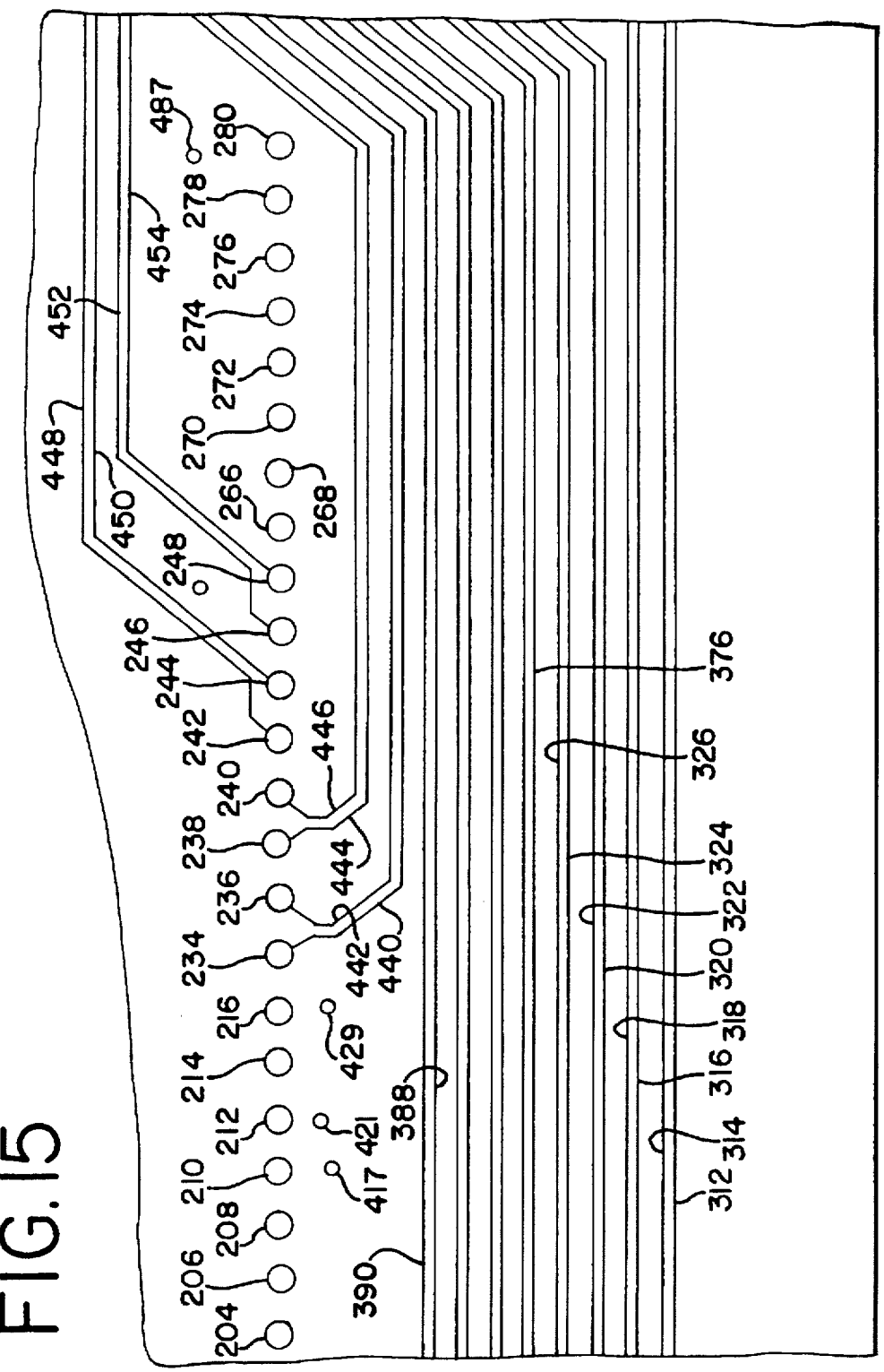
FIG. 15 is an enlarged plan view of a portion of the trace layout of FIG. 13 being that portion adjacent to the portion shown in FIG. 14.
Figure 17:
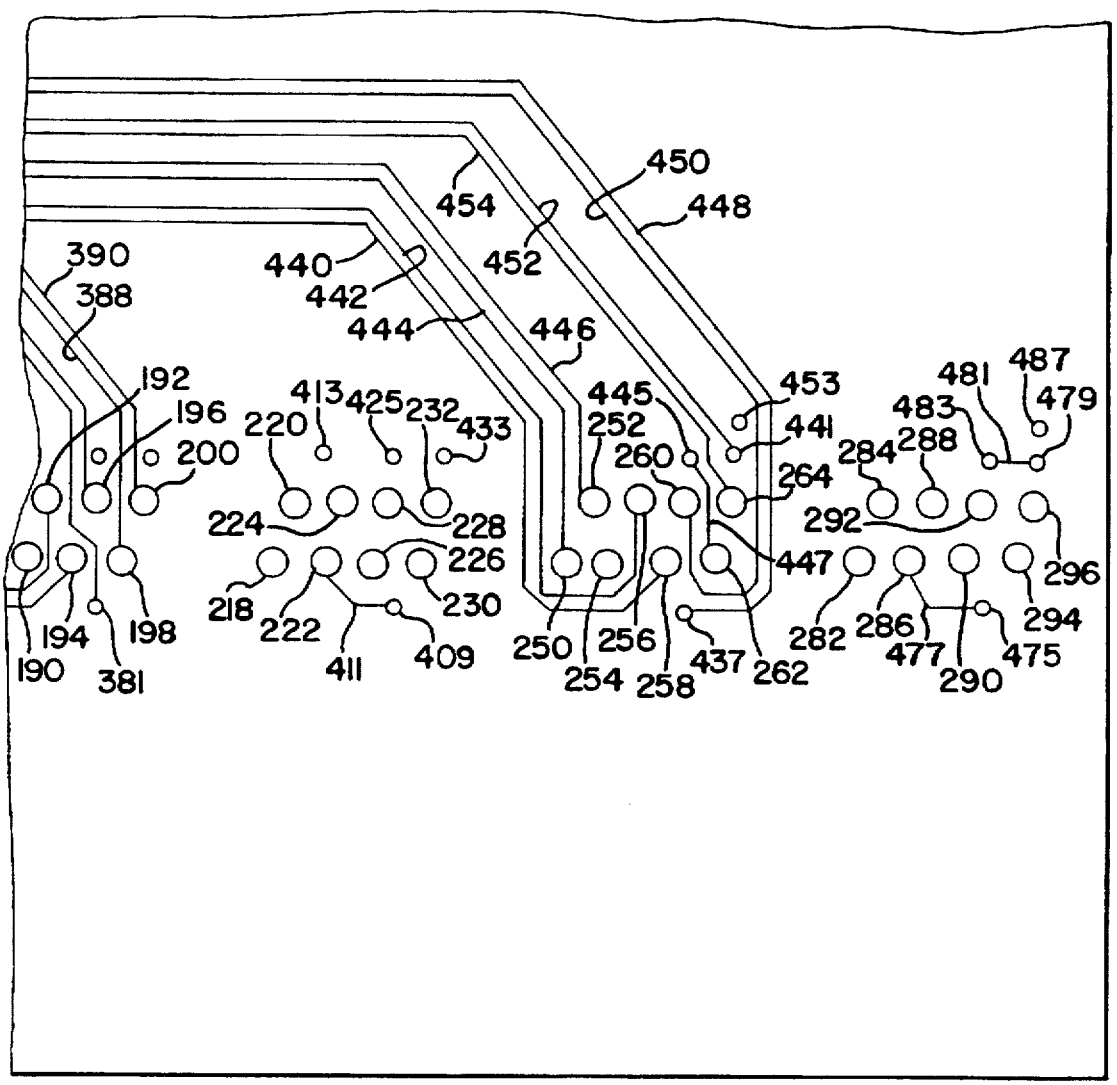
FIG. 17 is an enlarged plan view of a portion of the trace layout shown in FIG. 13 being that portion adjacent to the portion shown in FIG. 16 and extending to one end of the circuit layout.

The connection of the connector plated-through holes to the jack plated-through holes of port 56 by the signal trace or circuit conductors is shown in FIGS. 13, 15 and 17. Connector holes 234 and 236 are connected to jack holes 258 and 256, respectively, by a pair of substantially parallel signal traces 440 and 442, respectively. Connector holes 238 and 240 are connected to jack holes 250 and 252, respectively, by a pair of substantially parallel signal traces 444 and 446, respectively. Connector hole 242 is connected to jack hole 254 of signal trace 448 through transfer hole 437 and link trace 439. Connector hole 244 is connected to jack hole 260 by signal trace 450. Connector hole 246 is connected to jack hole 262 through transfer hole 441, link trace 443, transfer hole 445 and link trace 447 by signal trace 452. Connector hole 248 is connected to jack hole 264 by signal trace 454.

In each of the pairs of signal traces 440 and 442, 444 and 446, 448 and 450, and 452 and 454, the traces in each of the pairs are parallel to each other for substantially the entire length of the traces, except for the ends of the traces where the traces diverge for connection to the respective connector holes or jack holes.

Figure 20:
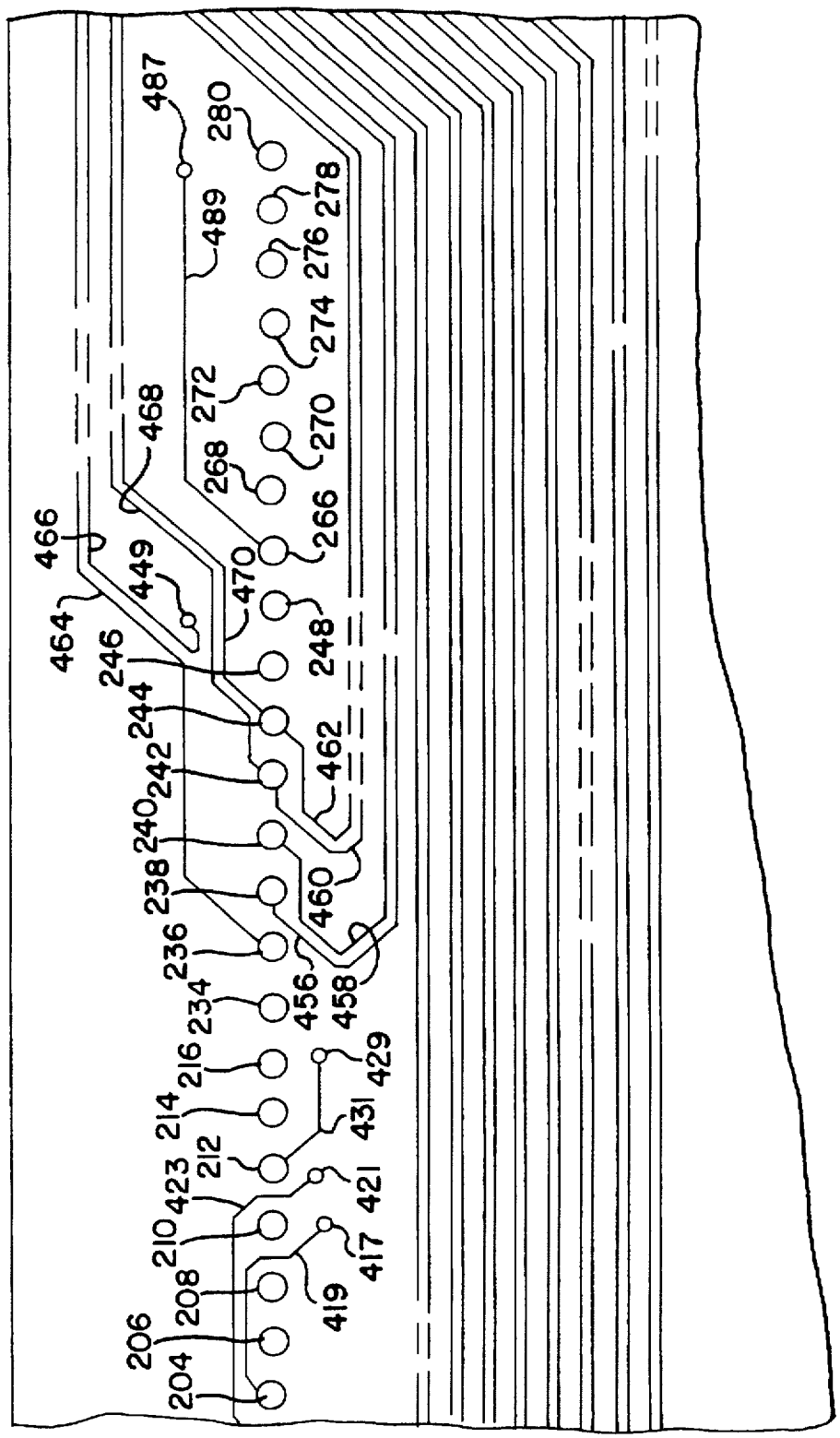
FIG. 20 is an enlarged plan view of a portion of the trace layout of FIG. 18 being that portion adjacent to the portion shown in FIG. 19.
Figure 22:
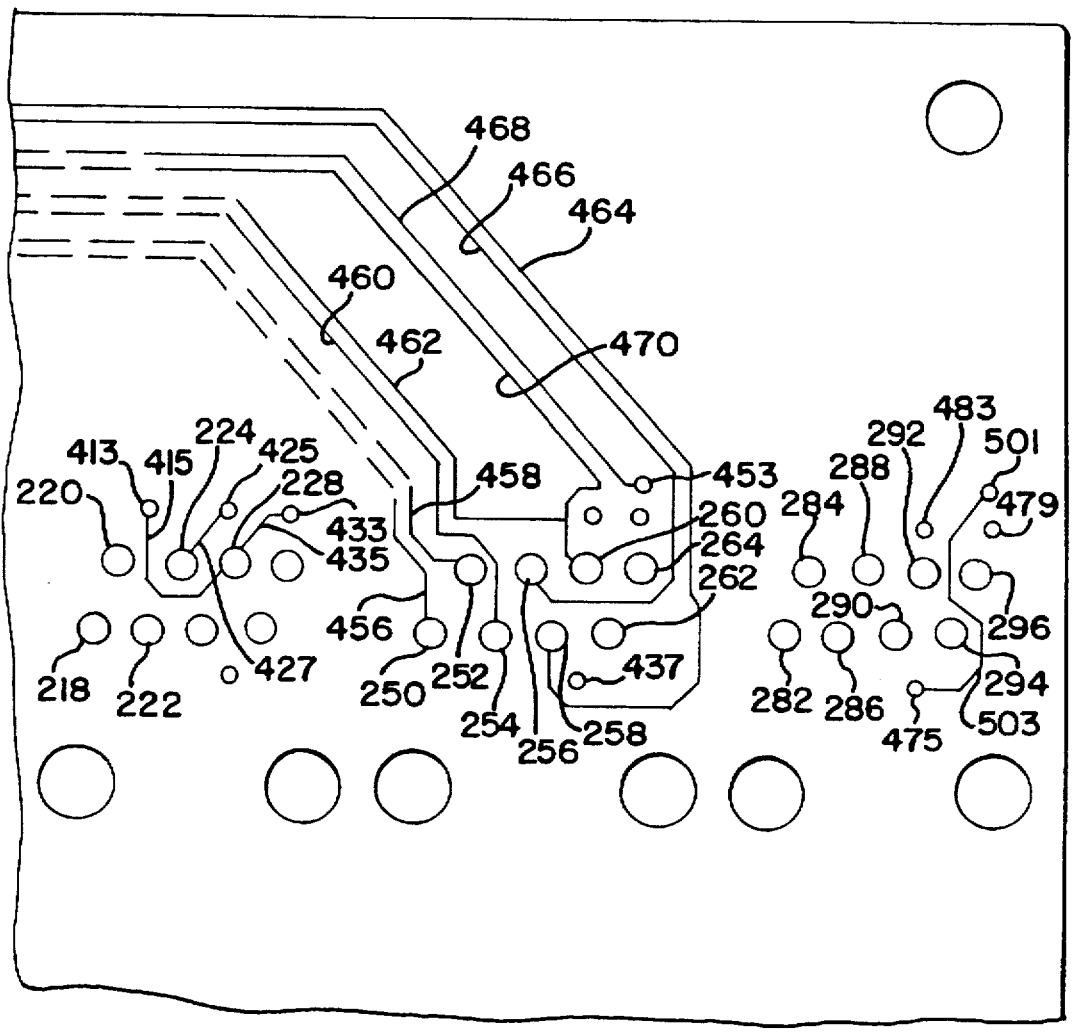
FIG. 22 is an enlarged plan view of a portion of the trace layout of FIG. 18 and being that portion adjacent to the portion adjacent to the portion shown in FIG. 21 and extending to one end of the circuit layout.

Each of the signal traces of port 56 has an aligned compensation trace parallel to and spaced therefrom. Compensation trace pattern 308 in FIGS. 18, 20 and 22 shows parallel compensation traces 456 and 458 which are aligned for a substantial portion of their lengths with the respective signal traces 440 and 442. Compensation trace 456 is connected to connector hole 238 at its connector end and the jack end is connected to jack hole 250. Compensation trace 458 has its connector end connected to connector hole 240 and its jack end connected to jack hole 252. Parallel compensation traces 460 and 462 are aligned with respective signal traces 444 and 446. The connector end of the compensator trace 460 is connected to connector hole 242 and the jack end is connected to jack hole 254. Compensation trace 462 has its connector end connected to connector hole 244 and its jack end connected to jack hole 260. Parallel compensation traces 464 and 466 are aligned with signal traces 448 and 450, respectively. Compensation trace 464 has its connector end connected to connector hole 236 and its jack end connected to jack hole 258. Compensation trace 466 has its connector end connected to connector hole 234 through transfer hole 449 and link trace 451 and its jack end connected to jack hole 256. Parallel compensation traces 468 and 470 are aligned with signal traces 452 and 454, respectively. Compensation trace 468 has its connector end connected to connector hole 242 and its jack end connected to jack hole 254 through transfer hole 453, link trace 455, transfer hole 437 and link trace 439. Compensation trace 470 has its connector end connected to connector hole 244 and its jack end connected to jack hole 260. Each of the compensation traces in port 56 has a gap in the trace of a magnitude identified for each trace in the table found below. Each of the compensation traces in port 56 in each of the pairs is parallel to the other trace of that pair.

The connection of the connector plated-through holes to the jack plated-through holes of port 62 by means of signal traces or circuit conductors is shown in FIGS. 8, 10 and 12. Connector holes 266 and 268 are connected to jack holes 290 and 288, respectively, by a pair of substantially parallel signal traces 472 and 474, respectively. Connector holes 270 and 272 are connected to jack holes 282 and 284, respectively, by a pair of substantially parallel signal traces 476 and 478, respectively. Connector hole 274 is connected to conductor trace 480 which is connected to jack hole 286 through transfer hole 475 and link trace 477. Connector hole 276 is connected to jack hole 292 by signal trace 482. Signal traces 480 and 482 are substantially parallel to each other. Connector hole 278 is connected to jack hole 294 by signal trace 484 through transfer hole 479, link trace 481, transfer hole 483 and link trace 485. Connector hole 280 is connected to jack hole 296 by signal trace 486.

In each of the pairs of signal traces 472 and 474, 476 and 478, 480 and 482, and 484 and 486, the traces in each of the pairs run parallel to each other for substantially the entire length of the traces, except for the ends of the traces where the traces diverge for connection to the respective connector holes or jack holes.

Each of the signal traces of port 62 has a parallel compensation trace spaced therefrom. Looking now to FIGS. 3, 5 and 7 showing compensation trace pattern 300, parallel compensation traces 488 and 490 are shown aligned for a substantial portion of their lengths with the respective signal traces 472 and 474. Trace 488 is connected to connector hole 270 at its connector end and the jack end is connected to jack hole 282. Compensation trace 490 has its connector end connected to connector hole 272 and its jack end connected to jack hole 284. Parallel compensation traces 492 and 494 are aligned with respective signal traces 476 and 478. The connector end of the compensator trace 492 is connected to connector hole 274 and the jack end is connected to jack hole 286. Compensation trace 494 has its connector end connected to connector hole 276 and its jack end connected to jack hole 292. Parallel compensation traces 496 and 498 are aligned with signal or conductor traces 480 and 482, respectively. Compensation trace 496 has its connector end connected to connector hole 268 and its jack end connected to jack hole 290. Compensation trace 498 has its connector end connected to connector hole 266 through transfer hole 487 and link trace 489 and its jack end connected to jack hole 288. Parallel compensation traces 500 and 502 are parallel to and aligned with signal traces 484 and 486, respectively. Compensation trace 500 has its connector end connected to connector hole 274 and its jack end connected to jack hole 286 through transfer hole 501, link trace 503, transfer hole 475 and link trace 477. Compensation trace 502 has its connector end connected to connector hole 276 and its jack end connected to jack hole 292. Each of the compensation traces of port 62 has a gap in the trace of a magnitude identified for each trace in the table found below. Each of the compensation traces in port 62 in each of the pairs is parallel to the other trace of that pair.

All of the connector plated-through holes, jack plated-through holes and transfer holes have the same general construction, that is, as shown in FIG. 23. The construction shown in FIG. 23 allows traces at different levels to be interconnected, as is well known in the art. All of the connector plated-through holes have the same inside diameter, to wit, 0.1067 centimeters (0.042 inches), though any other suitable size may be used with specific connector blocks. All of the jack plated-through holes have the same inside diameter, to wit, 0.089 centimeters (0.035 inches), though any other suitable size may be used with specific jacks. All of the transfer plated-through holes have the same inside diameter, to wit, 0.0457 centimeters (0.018 inches), though other sizes may be used.

Ports 68, 74, 80, 86, 92 and 98 have structures which are identical to ports 32, 38, 44, 50, 56 and 62, respectively. In light of the identity of construction, there is no detailed description of the ports 32, 38, 44, 50, 56 and 62, including the circuitry connecting the connectors with the jacks.

Each of the compensation traces is aligned with its respective signal trace, as illustrated in FIG. 24. Placement of the compensation traces aligned either above or below the respective signal traces for an electromagnetic connection between respective signal and compensation traces resulted in overcompensation for crosstalk. The optimum minimization of crosstalk is effected by making a gap in each of the compensation traces. The accompanying table identifies the specific length of each of the signal traces and respective compensation traces and the gap length in each compensation trace. In addition, the length of each compensation trace from the connector end to the gap and the length of each compensation trace from the jack end to the gap is set forth.

| | | Length of Traces in Centimeters | | | | |
|---|---|---|---|---|---|---|
| PORT | SIGNAL CONDUCTOR PAIR | COMPENSA- TION PAIR | TOTAL LENGTH | GAP LENGTH | LENGTH FROM CONNECTOR | LENGTH FROM JACK |
| 32 | 312 & 314 | 328 & 330 | 22.15 | 19.53 | 1.45 | 1.17 |
| 32 | 316 & 318 | 332 & 334 | 20.22 | 14.68 | 1.60 | 3.94 |
| 32 | 320 & 322 | 336 & 338 | 19.33 | 13.13 | 1.09 | 5.08 |
| 32 | 324 & 326 | 340 & 342 | 18.87 | 14.68 | 1.63 | 2.59 |
| 38 | 344 & 346 | 360 & 362 | 20.70 | 17.48 | 2.13 | 1.09 |

-continued

Length of Traces in Centimeters

| PORT | SIGNAL CONDUCTOR PAIR | COMPENSA-TION PAIR | TOTAL LENGTH | GAP LENGTH | LENGTH FROM CONNECTOR | LENGTH FROM JACK |
|---|---|---|---|---|---|---|
| 38 | 348 & 350 | 364 & 366 | 18.69 | 15.16 | 1.30 | 2.24 |
| 38 | 352 & 354 | 368 & 370 | 17.81 | 11.56 | 1.14 | 5.11 |
| 38 | 356 & 358 | 372 & 374 | 17.50 | 12.85 | 1.63 | 3.02 |
| 44 | 376 & 378 | 392 & 394 | 17.53 | 14.40 | 1.93 | 1.19 |
| 44 | 380 & 382 | 396 & 398 | 17.09 | 11.86 | 1.32 | 3.89 |
| 44 | 384 & 386 | 400 & 402 | 16.79 | 9.83 | 1.30 | 5.69 |
| 44 | 388 & 390 | 404 & 406 | 15.62 | 12.12 | 0.58 | 2.92 |
| 50 | 408 & 410 | 424 & 426 | 16.25 | 12.57 | 2.42 | 1.26 |
| 50 | 412 & 414 | 428 & 430 | 15.51 | 10.55 | 0.91 | 4.04 |
| 50 | 416 & 418 | 432 & 434 | 14.74 | 6.84 | 1.66 | 6.24 |
| 50 | 420 & 422 | 436 & 438 | 14.69 | 11.38 | 0.99 | 2.33 |
| 56 | 440 & 442 | 456 & 458 | 14.94 | 12.06 | 2.57 | 0.30 |
| 56 | 444 & 446 | 460 & 462 | 14.23 | 12.16 | 0.37 | 1.70 |
| 56 | 448 & 450 | 464 & 466 | 13.94 | 7.19 | 1.28 | 5.47 |
| 56 | 452 & 454 | 468 & 470 | 13.74 | 8.67 | 2.28 | 2.79 |
| 62 | 472 & 474 | 488 & 490 | 13.35 | 10.13 | 2.34 | 0.87 |
| 62 | 476 & 478 | 492 & 494 | 12.85 | 10.73 | 0.29 | 1.83 |
| 62 | 480 & 482 | 496 & 498 | 12.47 | 5.27 | 1.62 | 5.58 |
| 62 | 484 & 486 | 500 & 502 | 11.18 | 7.06 | 1.04 | 3.08 |

Figure 25:
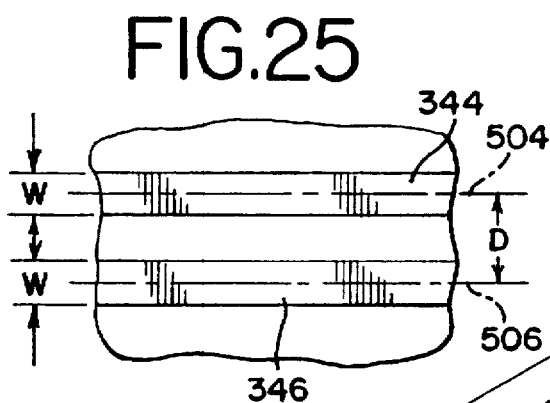
FIG. 25 is an enlarged fragmentary plan view taken of a pair of traces of FIG. 3.
Figure 26:
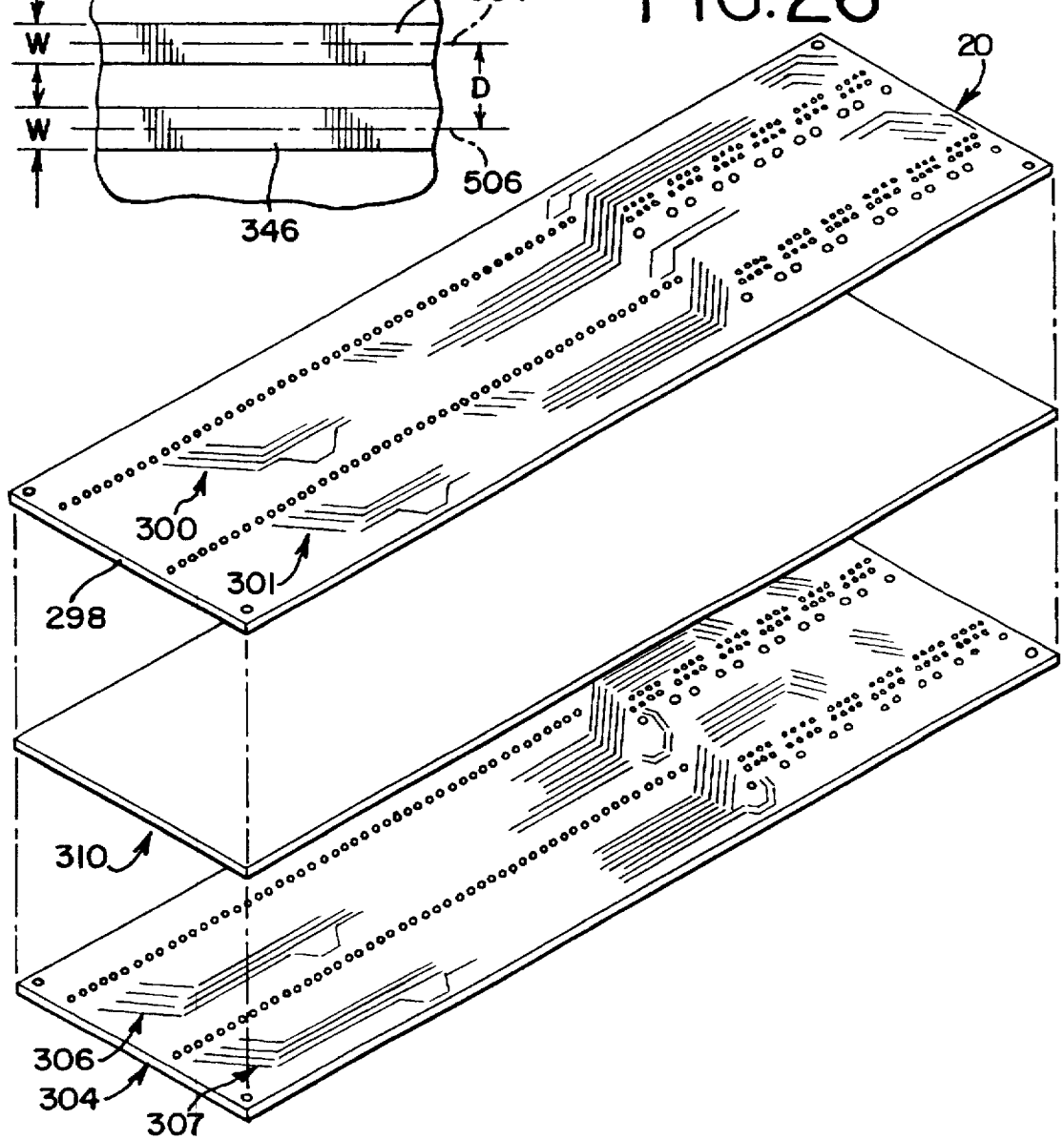
FIG. 26 is an exploded view of the circuit board which is part of the patch panel of FIG. 1.

Each of the traces in each of the trace patterns has a thickness of 0.0038 centimeters (0.0015 inch). The width of each trace and spacing of each pair of traces, both signal traces and compensation traces is the same for all trace patterns. FIG. 25 is illustrative of the spacing of the pairs of traces. The width "W" of each of the traces 360 and 362 is 0.030 centimeters (0.012 inch). Traces 360 and 362 have centerline 504 and 506, respectively. The distance "D" between centerlines is 0.045 centimeters (0.018 inch) so that the ratio of D to W is 1.5 for optimum low return loss. A range of D to W ratio from 1.0 to 2.0 produces acceptable low return losses. Though specific dimensions have been set forth for D and W, other dimensions are operative though the ratio mentioned above must be maintained.

The circuit board 20 is made by applying trace patterns 300 and 301 to the top of sheet 298 and trace patterns 302 and 303 to the bottom of sheet 298. Trace patterns 306 and 307 are applied to the top of sheet 304 and trace patterns 308 and 309 are applied to the bottom of sheet 304. Sheet 310 is positioned between sheets 298 and 304 and the three sheets are fused together. The top of the sheet 298 and the bottom of sheet 304 is each coated with a conventional solder mask 508 to provide an outside insulator covering for the circuitry. Connectors are mounted in the connector holes and jacks are mounted in the jack holes to complete the electrical circuitry of the patch panel.

Although a specific embodiment of the herein disclosed invention has been shown and described in detail above, it is readily apparent that those skilled in the art may make various modifications and changes without departing from the spirit and scope of the present invention. It is to be expressly understood that the scope of this invention is limited only by the appended claims.

What is claimed is:

1. A low return loss and low crosstalk electric circuit for use in connecting portions of a telecommunications system comprising: a pair of elongated circuit conductors, said conductors being parallel to each other over a substantial portion of their respective lengths, each of said conductors having a surface in a single plane, a pair of compensation traces spaced from and electromagnetically connected to the conductors, said compensation traces having a surface in a second plane spaced from and parallel to the single plane of the conductors, a pair of elongated cognate circuit conductors, said cognate conductors parallel to each other over a portion of their respective lengths, each of said cognate conductors having a surface in a second single conductor plane, said second single conductor plane being spaced from and parallel to the single plane of the first-mentioned elongated circuit conductors, a pair of cognate compensation traces spaced from and electromagnetically connected to the cognate conductors, said pair of cognate compensation traces having a surface in a second compensator plane spaced from and parallel to the second single conductor plane and being spaced away from the single plane of the first-mentioned elongated circuit conductors a greater distance than from the second single conductor plane.

2. A low return loss and low crosstalk electric circuit for use in connecting portions of a telecommunications system as defined in claim 1: wherein each of the compensation traces of the first-mentioned pair of compensation traces and each of the cognate compensation traces of the pair of cognate compensation traces has a gap.

3. A low return loss and low crosstalk electric circuit for use in connecting portions of a telecommunications system as defined in claim 1: wherein each of the compensation traces of the first-mentioned pair of compensation traces has a substantial portion of its length aligned with a portion of a respective conductor of the first-mentioned pair of circuit conductors, each of the cognate compensation traces of the pair of cognate compensation trace has a substantial portion of its length aligned with a portion of a respective cognate conductor.

4. A low return loss and low crosstalk electric circuit for use in connecting portions of a telecommunications system comprising: a pair of elongated circuit conductors, said conductors being parallel to each other over a substantial portion of their respective lengths, each of said conductors having a surface in a single plane, a pair of compensation traces spaced from and electromagnetically connected to the conductors, said compensation traces having a surface in a second plane spaced from and parallel to the single plane of the conductors, each of the compensation traces has a gap interrupting its length to effect minimization of talk.

5. A low return loss and low crosstalk electric circuit for use in connecting portions of a telecommunications system comprising: a pair of elongated signal traces, each trace having a uniform width over substantially the entire length of the trace, each signal trace having a width equal to the width of the other signal trace over substantially the entire lengths of the traces, said signal traces being in a signal trace plane, said signal traces being spaced apart a uniform distance over a substantial length of each of the traces, said uniform distance determined at the center of each signal trace to the center of other signal trace and being no greater than twice the width of one of the signal traces, a pair of compensation traces separated from the pair of signal traces, each of said compensation traces having a uniform width over a substantial length of the trace, each of said compensation traces having a width equal to the width of the other compensation trace of the pair over a substantial length of the traces, said compensation traces being in a single compensation trace plane, said compensation trace plane being spaced from and parallel to the signal trace plane, each compensation trace being electromagnetically connected to a signal trace, a pair of elongated cognate signal traces, each cognate signal trace having a uniform width over substantially the entire length of the trace, each of the cognate signal traces having a width equal to the width of the other cognate signal trace over substantially the entire lengths of the traces, said cognate signal traces being in a second signal trace plane parallel to and spaced from the first-mentioned signal trace plane, said cognate signal traces being spaced apart a second uniform distance over a substantial length of the cognate signal traces, said second uniform distance determined by the distance between the centers of cognate signal traces and being no greater than twice the width of one of the cognate signal traces, a pair of cognate compensation traces in a second compensation trace plane, said second compensation trace plane spaced from and parallel to the second signal trace plane, and each cognate compensation trace being electromagnetically connected to a cognate signal trace.

6. A low return loss and low crosstalk electric circuit for use in connecting portions of a telecommunications system as defined in claim 5: wherein each of the first-mentioned pair of compensation traces has a gap, each of the first-mentioned pair of compensation traces has a portion of its length aligned with a portion of a length of a respective signal trace of the first-mentioned pair of signal traces, each cognate compensation trace has a gap, and each cognate compensation trace has a portion of its length aligned with a portion of a length of a respective cognate signal trace.

7. A low return loss and low crosstalk electric circuit for use in connecting portions of a telecommunications system comprising: a pair of elongated signal traces parallel to each other over a substantial portion of their respective lengths, each of said signal traces having a uniform width over a substantial portion of the lengths of the trace, each signal trace having a width equal to the width of the other signal trace over a substantial portion of the lengths of the traces, said signal traces being in a signal trace plane, a pair of compensation traces in a compensation trace plane, said compensation trace plane spaced from and parallel to the signal trace plane, one of said compensation traces aligned with one of the signal traces over a substantial portion of the lengths of the traces and the other compensation trace of pair of compensation traces being aligned with the other signal trace over a substantial portion of the lengths of the traces, whereby each compensation trace is electromagnetically connected to its respective signal trace, a pair of elongated cognate signal traces parallel to each other for a substantial portion of their respective lengths, each of the cognate signal traces having a uniform width over a substantial portion of the length of the trace, each cognate signal trace having a width equal to the width of the other cognate signal trace over a substantial portion of the lengths of the traces, said cognate signal traces being in a second signal trace plane, said second signal trace plane positioned adjacent to and parallel to the first-mentioned signal trace plane, a pair of cognate compensation traces in a second compensation trace plane spaced from and parallel to the second signal trace plane and being positioned on a side of the second signal trace plane away from the first-mentioned signal trace plane, and one of said cognate compensation traces having a portion aligned with a portion of one of the cognate signal traces and the other cognate compensation trace having a portion aligned with a portion of the other cognate signal trace, whereby each cognate compensation trace is electromagnetically connected to its respective cognate signal trace.

8. A low return loss and low crosstalk electric circuit for use in connecting portions of a telecommunications system comprising: a pair of elongated signal traces having a uniform width over substantially the entire length of each trace, each signal trace having a width equal to the width of the other signal trace over substantially the entire lengths of the traces, said signal traces being in a signal trace plane, said signal traces being spaced apart a uniform distance over a substantial length of the pair of traces, said uniform distance determined from the center of each signal trace to the center of the other of said traces, said uniform distance being no greater than twice the width of one of the signal traces, a pair of compensation traces spaced from the pair of signal traces, each of said compensation traces having a gap interrupting its length to effect minimization of crosstalk, said compensation traces being in a single compensation trace plane, said compensation trace plane being spaced from and parallel to the signal trace plane, and each compensation trace being electromagnetically connected to a respective signal trace.

9. A low return loss and low crosstalk electric circuit for use in connecting portions of a telecommunications system comprising: a pair of elongated circuit conductors parallel to each other over a substantial portion of their respective lengths, each of said circuit conductors is a signal trace, and a pair of compensation traces in a compensation trace plane, each of said compensation traces has a gap in the trace interrupting its length to effect minimization of crosstalk, said signal traces are in a second plane spaced from and parallel to the compensation trace plane, each of said compensation traces has a portion aligned with a portion of a respective signal trace, whereby said compensation traces are electromagnetically connected to respective signal traces.

* * * * *